(12) United States Patent
Hsieh

(10) Patent No.: US 8,658,492 B2
(45) Date of Patent: Feb. 25, 2014

(54) SEMICONDUCTOR POWER DEVICE INTEGRATED WITH ESD PROTECTION DIODES

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/542,753

(22) Filed: Jul. 6, 2012

(65) Prior Publication Data

US 2013/0234238 A1    Sep. 12, 2013

Related U.S. Application Data

(63) Continuation-in-part of application No. 13/417,397, filed on Mar. 12, 2012.

(51) Int. Cl.
*H01L 27/06* (2006.01)

(52) U.S. Cl.
USPC ........... 438/237; 438/481; 438/173; 438/156; 257/328; 257/E21.09; 257/E27.016

(58) Field of Classification Search
USPC ............. 257/328, E27.016, E21.09; 438/481, 438/237, 153, 173
See application file for complete search history.

(56) References Cited

U.S. PATENT DOCUMENTS

2010/0289073 A1*  11/2010  Hsieh ............................ 257/328

* cited by examiner

*Primary Examiner* — Mamadou Diallo
(74) *Attorney, Agent, or Firm* — Bacon & Thomas, PLLC

(57) ABSTRACT

A semiconductor power device integrated with ESD protection diode is disclosed by offering a dopant out-diffusion suppression layers prior to source dopant activation or diffusion to enhance ESD protection capability between gate and source.

12 Claims, 26 Drawing Sheets

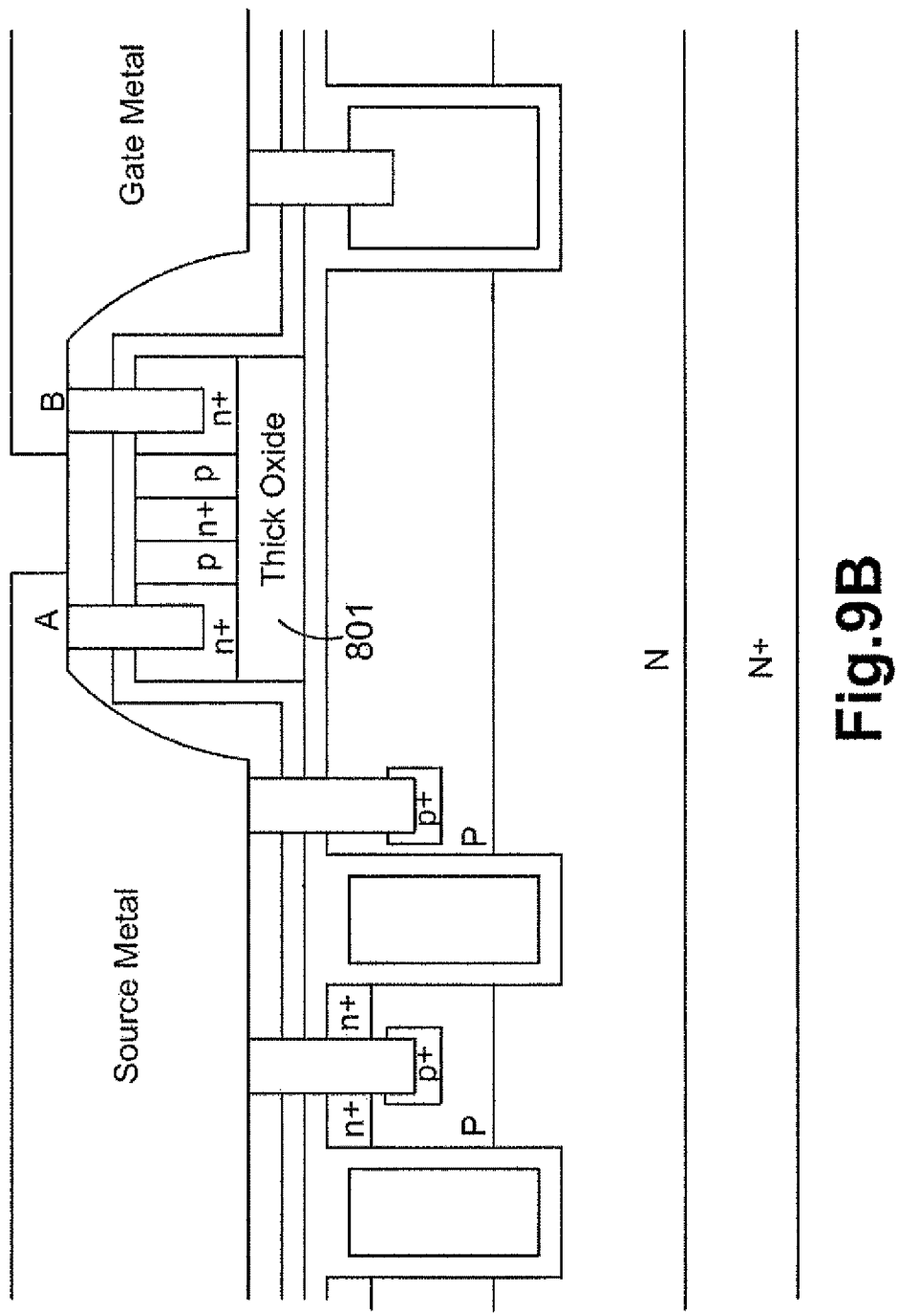

SEMICONDUCTOR POWER DEVICE INTEGRATED WITH ESD PROTECTION DIODES

This application is a Continuation-In-Part (CIP) of U.S. patent application Ser. No. 13/417,397 of the same inventor, filed on Mar. 12, 2012, entitled "semiconductor power device integrated with clamp diodes having dopant out-diffusion suppression layers".

FIELD OF THE INVENTION

1. Field of the Invention

This invention generally relates to improved trench MOSFET (Metal Oxide Semiconductor Field Effect Transistor) configuration integrated with improved ESD (Electrostatic Discharge) protection diodes and improved method to make the same.

2. Background of the Invention

For a semiconductor power device, for example a trench MOSFET device integrated with ESD protection diodes, Igss and BVgss are key parameters to measure performance of the ESD protection diodes, wherein the Igss defined by gate-source current at max. Vgs spec (maximum voltage spec between gate and source), e.g. 20V, is usually kept below 10 uA and the BVgss is usually defined by the voltage drop between gate and source at Igss=300 uA. Besides, the ESD capability is higher when the BVgss is lower because the ESD protection diodes are turned on earlier. Therefore, in order to achieve lower BVgss, the Igss is kept at a high level without exceeding the Igss spec of 10 uA.

FIGS. 1A to 1D show some trench MOSFET configurations integrated with ESD protection diodes of prior art. FIG. 1A illustrates a trench MOSFET 100 disclosed in the prior art of U.S. Pat. No. 6,657,256 (device) and U.S. Pat. No. 6,884,683 (method) wherein the integrated ESD protection diodes comprising multiple back to back Zener diodes composed of alternating doped regions of n+/p/n+ is formed onto an oxide layer 101, and is further connected to a source metal 102 on one side while connected to a gate metal 103 on another side via planar diode contacts. FIG. 1B illustrates a trench MOSFET 200 disclosed in the prior art of U.S. Pub. No. 2007/0176239 which further comprises a thick oxide layer 202 between the oxide layer 201 and the integrated ESD protection diodes comprising multiple back to back Zener diodes composed of alternating doped regions of n+/p/n+/p/n+. Besides, the integrated ESD protection diodes in FIG. 1B are connected to the source metal 203 on one side while connected to the gate metal 204 on another side respectively via trenched diode contacts 205 and 206 filled with contact metal plugs. FIG. 1C illustrates a trench MOSFET 300 disclosed in the prior art of U.S. Pat. No. 8,004,009 which further comprises a nitride layer 307 between the oxide layer 301 and the thick oxide layer 302 to prevent body region damage and punch-through issues from happening comparing to FIG. 1B. FIG. 1D illustrates a trench MOSFET 400 disclosed in the prior art of U.S. Pat. No. 7,956,410 wherein the integrated ESD protection diodes are formed onto the oxide layer 401 and are connected to the source metal 402 on one side and connected to the gate metal 403 on another side respectively via the trenched diode contacts 404 and 405 filled with the contact metal plugs. Besides, underneath each of the trenched diode contacts 404 and 405, a trenched gate 406 is formed to act as buffer trenched gate to prevent the gate-body shortage issue from happening. In FIG. 2G, a plurality of contact trenches 410~1 to 410~5 are formed each having same width from top to bottom. In FIG. 2H, a contact metal plug 412 is formed in each of the contact trenches 410-1~410-5.

The cathode regions (n+ regions) of the integrated ESD protection diodes discussed above are all formed by performing source diffusion after carrying out source dopant ion implantation into bare poly-silicon layer without having any oxide on top surface of the poly-silicon layer, which is similar to the process flow illustrated in FIGS. 2A to 2H disclosed in prior art of U.S. Pat. No. 7,956,410 which has the same inventor and the same assignee as the present invention. After forming a plurality of trenched gates 501 and a plurality of P body regions 502 in N epitaxial layer 503 onto an N+ substrate 500 in FIGS. 2A and 2B, an un-doped poly-silicon layer 504 are formed lining top of the N epitaxial layer 503 and is then implanted by a body dopant in FIG. 2C. After that, the poly-silicon layer 504 with body dopant is patterned by a poly mask in FIG. 2D, and is implanted by source dopant defined by a source mask as shown in FIG. 2E. Next, a step of source diffusion is performed to form multiple n+ cathode regions 505 of the integrated ESD protection diodes without having any dopant out-diffusion suppression layer on top surface of the poly-silicon layer 504. Therefore, the source dopant and the body dopant in the poly-silicon layer is easily out diffused non-uniformly across wafer and from wafer to wafer during thermal diffusion such as source activation or diffusion for formation of n+ source regions 506 in trench MOSFET and for n+ cathode regions 505 in the integrated ESD protection diodes at the same time, resulting in high Igss and high BVgss standard deviation as shown in Table. 1 wherein a group of experiment data is given, showing the comparison between the prior arts and the present invention. Therefore, the prior arts discussed above usually encounter high Igss yield loss due to the high Igss standard deviation. The yield becomes unstable as result of the Igss out of spec (e.g. >10 uA) when Vgs=20V, therefore in order to keep good yield, the average Igss is kept relatively low, however, the BVgss becomes higher, resulting in low ESD capability. Therefore, the prior arts encounter a trade-off between the ESD capability and yield due to the limit of the Igss for less power consumption as mentioned above.

Therefore, there is still a need in the art of the semiconductor device configuration, particularly for d fabrication of trench semiconductor device integrated with ESD protection diodes, to provide a novel method of manufacturing trench MOSFETs integrated with ESD protection diodes that would resolve these difficulties and design limitations.

SUMMARY OF THE INVENTION

It is therefore an object of the present invention to provide an improved method of manufacturing semiconductor power device integrated with ESD protection diodes to solve the problems discussed above to benefit yield enhancement by forming a dopant out-diffusion suppression layer after the source dopant implantation prior to the source activation or diffusion, wherein the dopant out-diffusion suppression layer is covering outer surface of the ESD protection diodes comprising multiple back-to-back doped regions with a first conductivity type next to a second conductivity type. From the Table. 1, it can be seen that, by forming the inventive dopant out-diffusion suppression layer, the standard deviation in both Igss and BVgss are significantly reduced. The dopant out-diffusion suppression layer can be implemented by depositing an un-doped oxide layer (0.5KÅ~3KÅ) after source dopant implantation. The un-doped oxide layer is also acted as a first contact interlayer. The experiment results indicate that this invention benefits yield enhancement.

According to another aspect of the present invention, prior to formation of the dopant out-diffusion suppression layer, the method of manufacturing semiconductor power device integrated with at least one ESD protection diode further comprises: forming a plurality of trenched gates and a plurality of body regions of the second conductivity type in an epitaxial layer of the first conductivity type which is supported onto a substrate heavily doped with the first conductivity type; depositing an un-doped poly silicon layer over the epitaxial layer; carrying out blank ion implantation with dopant of the second conductivity type; applying a poly mask and etching the un-doped poly-silicon layer, leaving necessary portion for formation of the ESD protection diodes; applying a source mask and carrying out source dopant of the first conductivity type for formation of source region in the trench MOSFET and cathode (or anode, depending on the type of the trench MOSFET) regions in the ESD protection diodes. In some preferred embodiments, after carrying out blank ion implantation with dopant of the second conductivity type and before applying the poly mask, the method further comprises carrying out another blank ion implantation of Fluorine to form an additional dopant out-diffusion suppression layer to further reduce the dopant out-diffusion from the ESD protection diodes. In some preferred embodiments, before applying the source mask, the method further comprises depositing an un-doped oxide layer as a source implantation screen oxide. In some preferred embodiments, before depositing the un-doped poly-silicon layer, the method further comprises depositing a thick oxide layer on top of the first oxide layer to act as buffer layer to prevent over-etching issue during forming trenched diode contacts. In some other preferred embodiments, before depositing the un-doped poly-silicon layer, the method further comprises successively depositing a nitride layer and a thick oxide layer after formation of the body regions to form an ONO structure as buffer layer to prevent over-etching issue during forming trenched diode contacts.

According to another aspect of the present invention, after the source activation or diffusion with the dopant out-diffusion suppression layer to form a plurality of source regions, the method further comprises: depositing a BPSG (Boron Phosphorus Silicon Glass) layer overlying the dopant out-diffusion suppression layer as a second contact interlayer and followed by a step of BPSG flow; applying a contact mask and forming a plurality of contact trenches defined by the contact mask, wherein the contact trenches comprise at least two ESD contact trenches and a plurality of source-body contact trenches, each of said ESD contact trenches are extending into doped regions of the first conductivity type and the source-body contact trenches penetrating through the source regions and extending into the body regions; carrying out ion implantation with dopant of the second conductivity type to form a body contact doped region surrounding at least each bottom of the contact trenches which are extending into the body regions; forming a contact metal plug in each of the contact trenches; depositing a front metal layer on top of the trench MOSFET and the ESD protection diodes; applying a metal mask and carrying out metal etch to respectively form a gate metal and a source metal; depositing a back metal layer on rear side of the substrate after backside grinding. In some preferred embodiments, after forming a plurality of contact trenches, the method further comprises dipping additional dilute HF to enlarge top surface contact CD (Critical Dimension) of the contact trenches by selectively removing 500 Å~1000 Å BPSG.

Embodiments of the present invention also comprises trench MOSFETs integrated with ESD protection diodes. Briefly, the trench MOSFET comprises a dopant out-diffusion suppression layer covering outer surface of the integrated ESD protection diodes. More preferred, the trench MOSFET further comprises a screen oxide for source dopant ion implantation underneath the source dopant out-diffusion suppression layer. In some embodiments, the trench MOSFET also comprises a trenched gate right below each of the trenched diode contacts to act as a buffer trenched gate to prevent over-etching issue from happening, causing gate and drain shortage. In yet other embodiments, the trench MOSFET also comprises a thick oxide underneath the integrated ESD protection diodes to act as a buffer layer to prevent over-etching issue from happening. In yet other embodiments, the trench MOSFET also comprises a thick oxide padded by a nitride layer underneath the integrated ESD protection diodes to prevent over-etching issue from happening. The trench MOSFET further comprises a plurality of contact trenches for formation of trenched diode contacts and trenched source-body contacts. In some embodiments, the contact trenches each has same contact CD along sidewalls from top to bottom. In yet other embodiments, the contact trenches each has greater contact CD near top sidewalls than near bottom sidewalls. In some embodiments, the integrated ESD protection diodes comprise multiple back-to-back doped regions with the first conductivity type next to the second conductivity type. In yet other embodiments, the integrated ESD protection diodes further comprise an additional dopant out-diffusion suppression layer into upper portion of the ESD protection diodes, wherein the additional dopant out-diffusion suppression layer contains Fluorine and comprises multiple doped regions with the first conductivity type next to the second conductivity type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 9A to 9B are a serial of side cross-sectional views for showing some process steps for making a trench MOSFET integrated with ESD protection diodes according to another preferred embodiment of the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
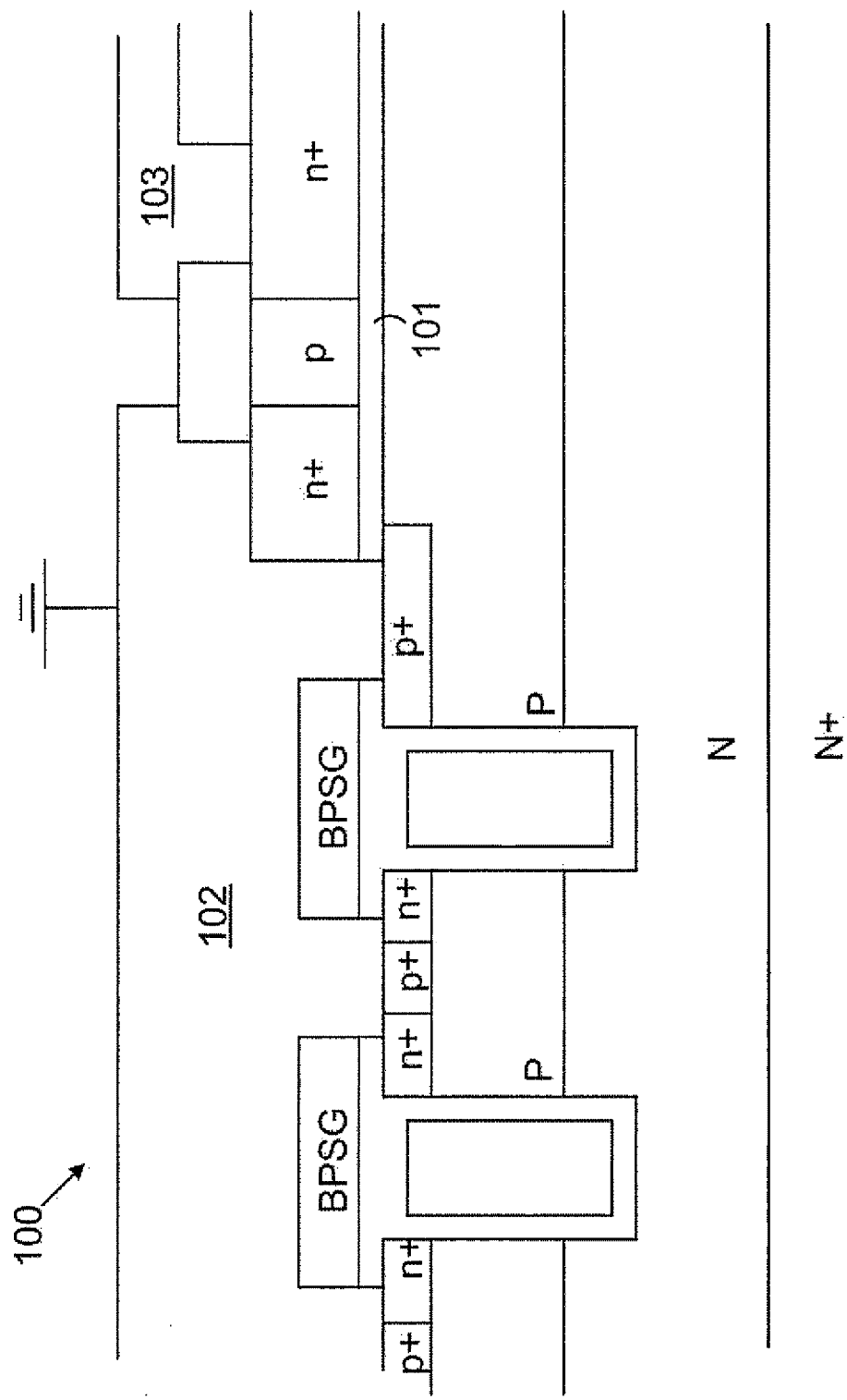
FIG. 1A is a side cross-sectional view of a trench MOSFET integrated with ESD protection diodes disclosed in a prior art.
Figure 1B:
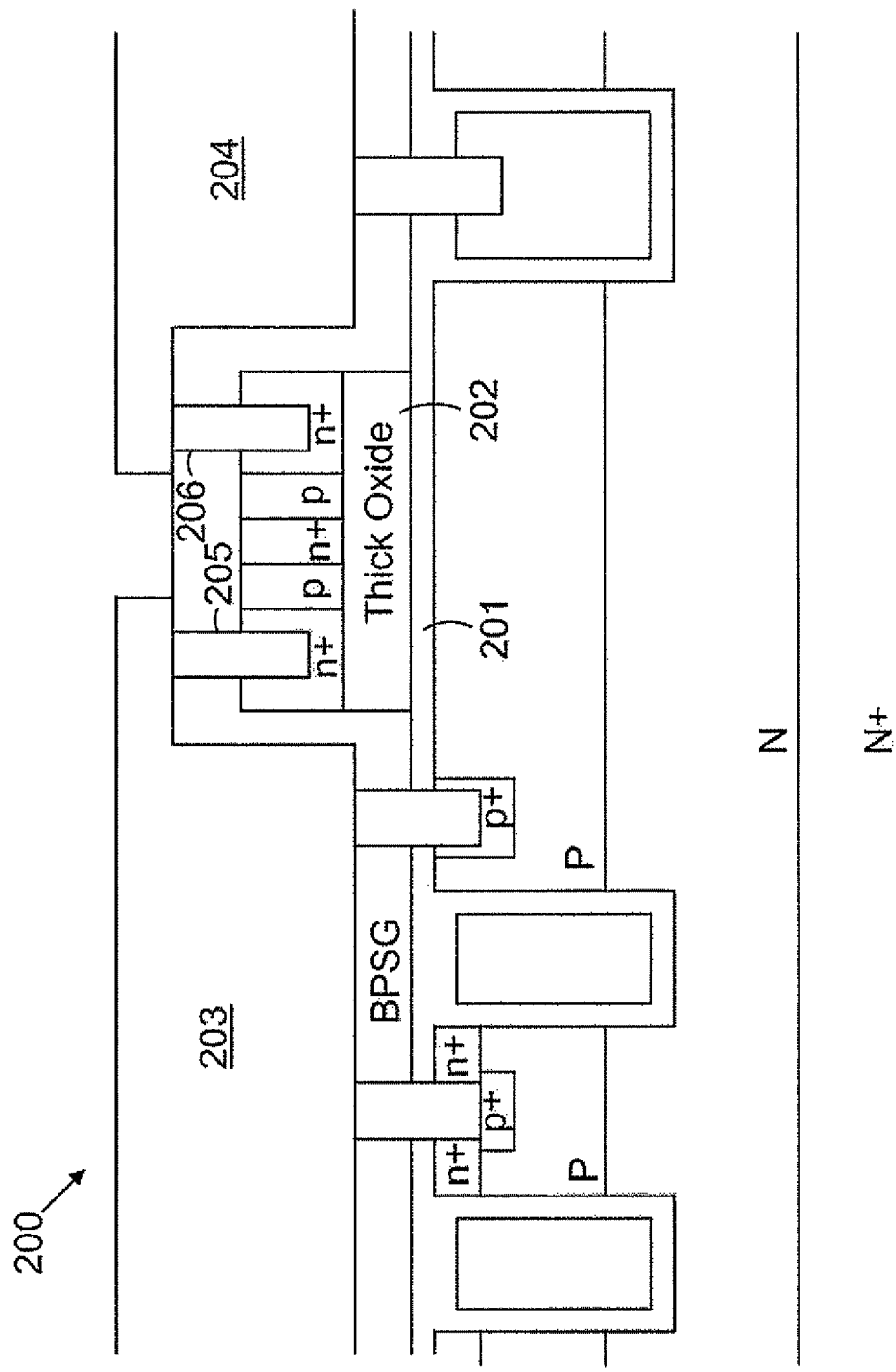
FIG. 1B is a side cross-sectional view of a trench MOSFET integrated with ESD protection diodes disclosed in another prior art.
Figure 1C:
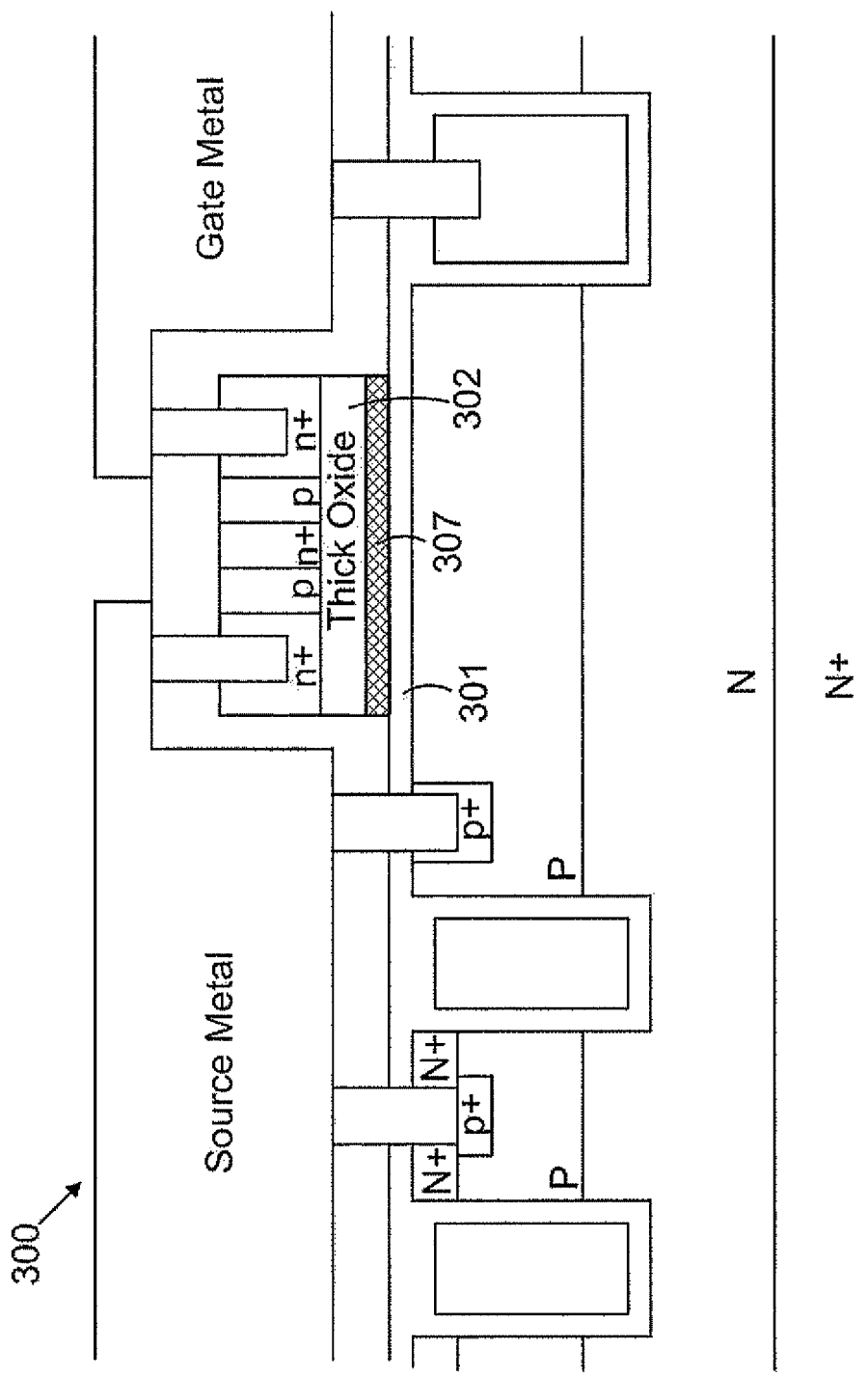
FIG. 1C is a side cross-sectional view of a trench MOSFET integrated with ESD protection diodes disclosed in another prior art.
Figure 1D:
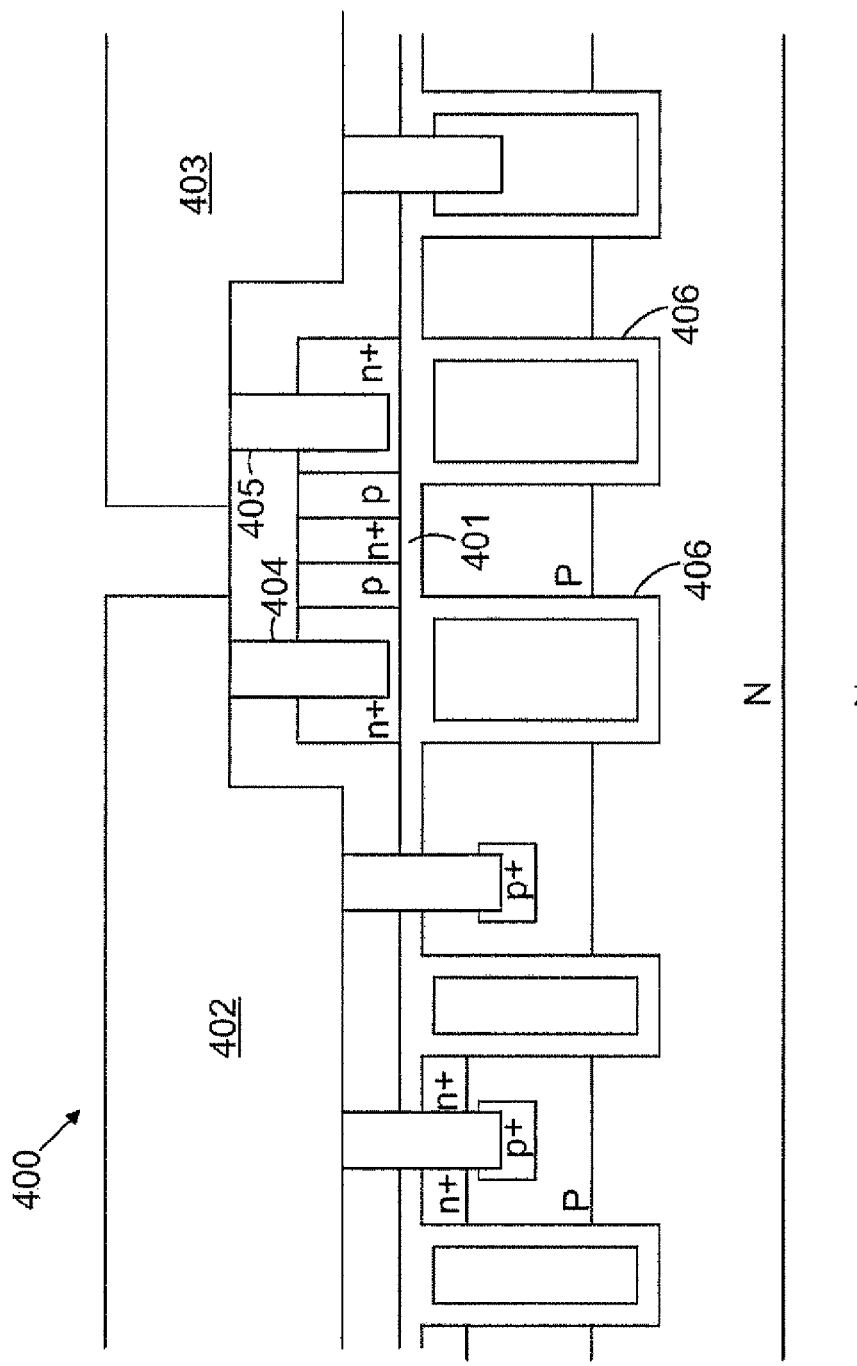
FIG. 1D is a side cross-sectional view of a trench MOSFET integrated with ESD protection diodes disclosed in another prior art.
Figure 2A:
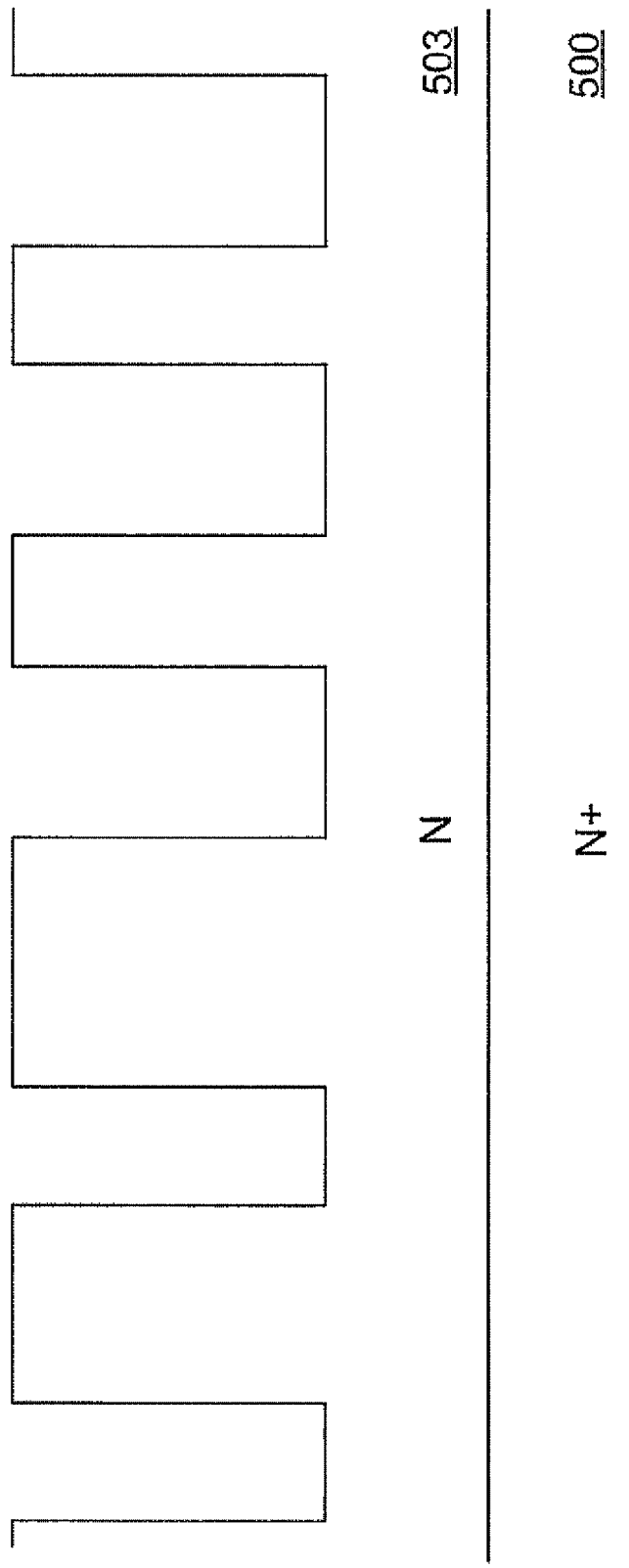
FIGS. 2A to 2H are a serial of side cross-sectional views for showing the conventional process steps for making a trench MOSFET integrated with ESD protection diodes disclosed in prior art.
Figure 2B:
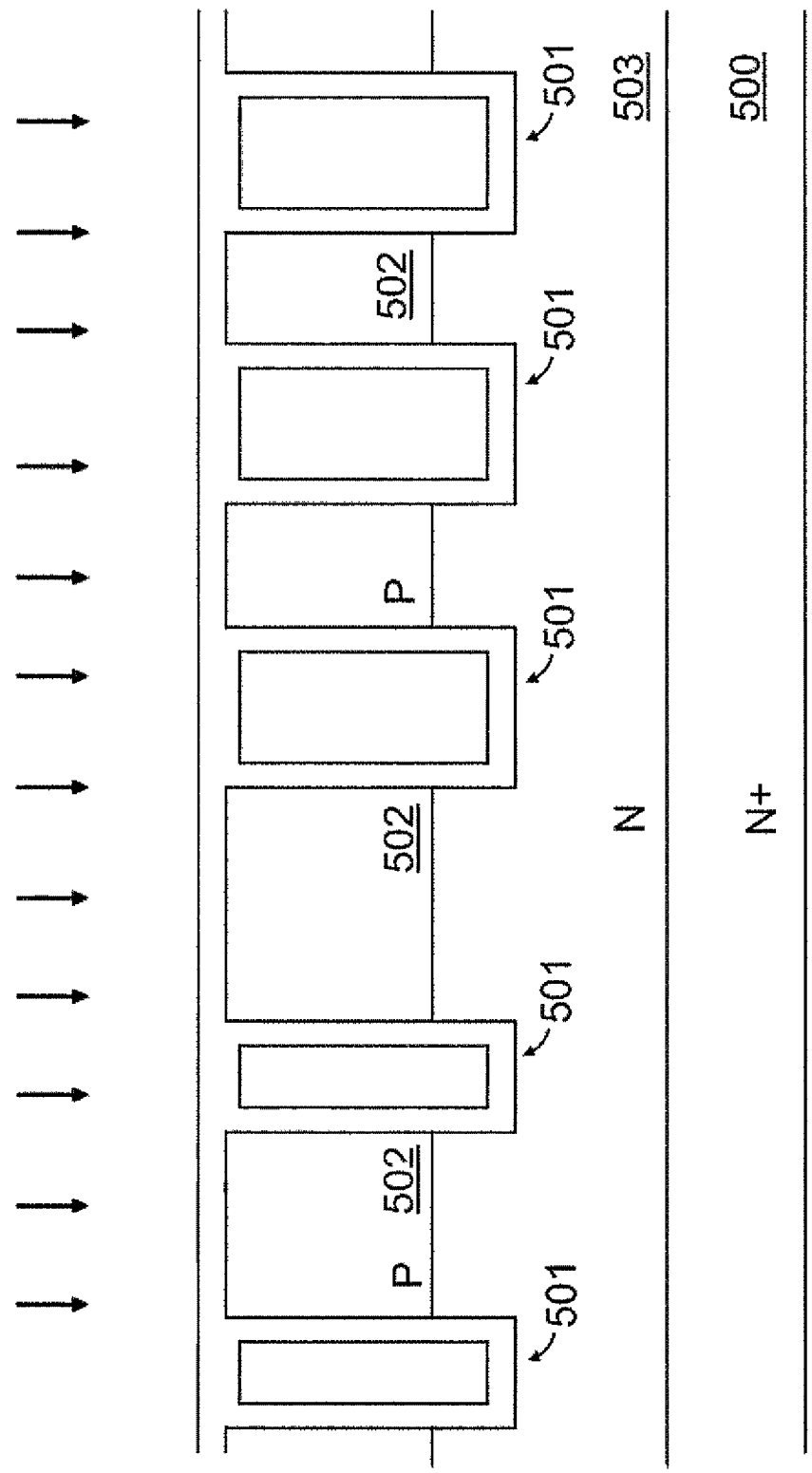
Figure 2C:
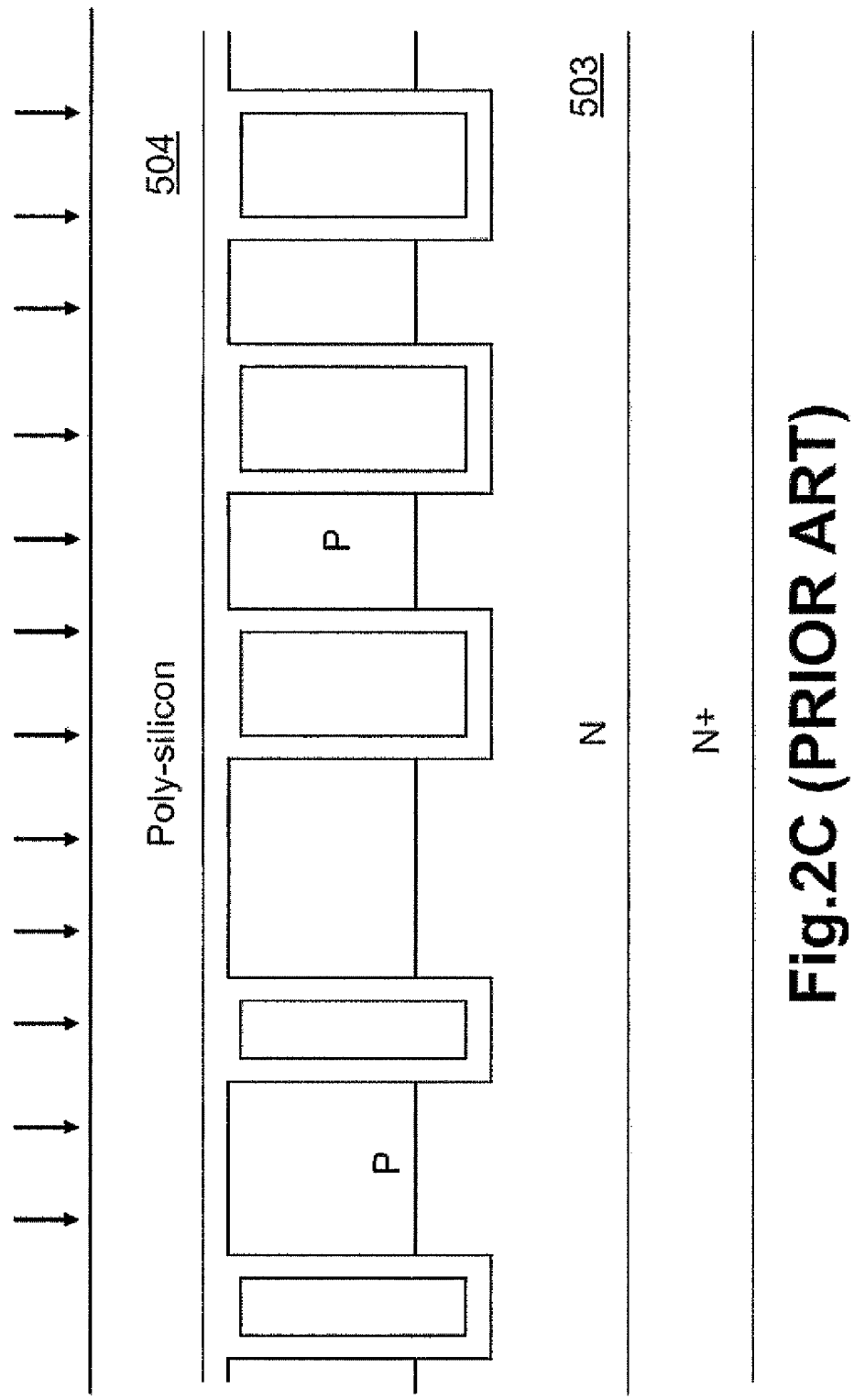
Figure 2D:
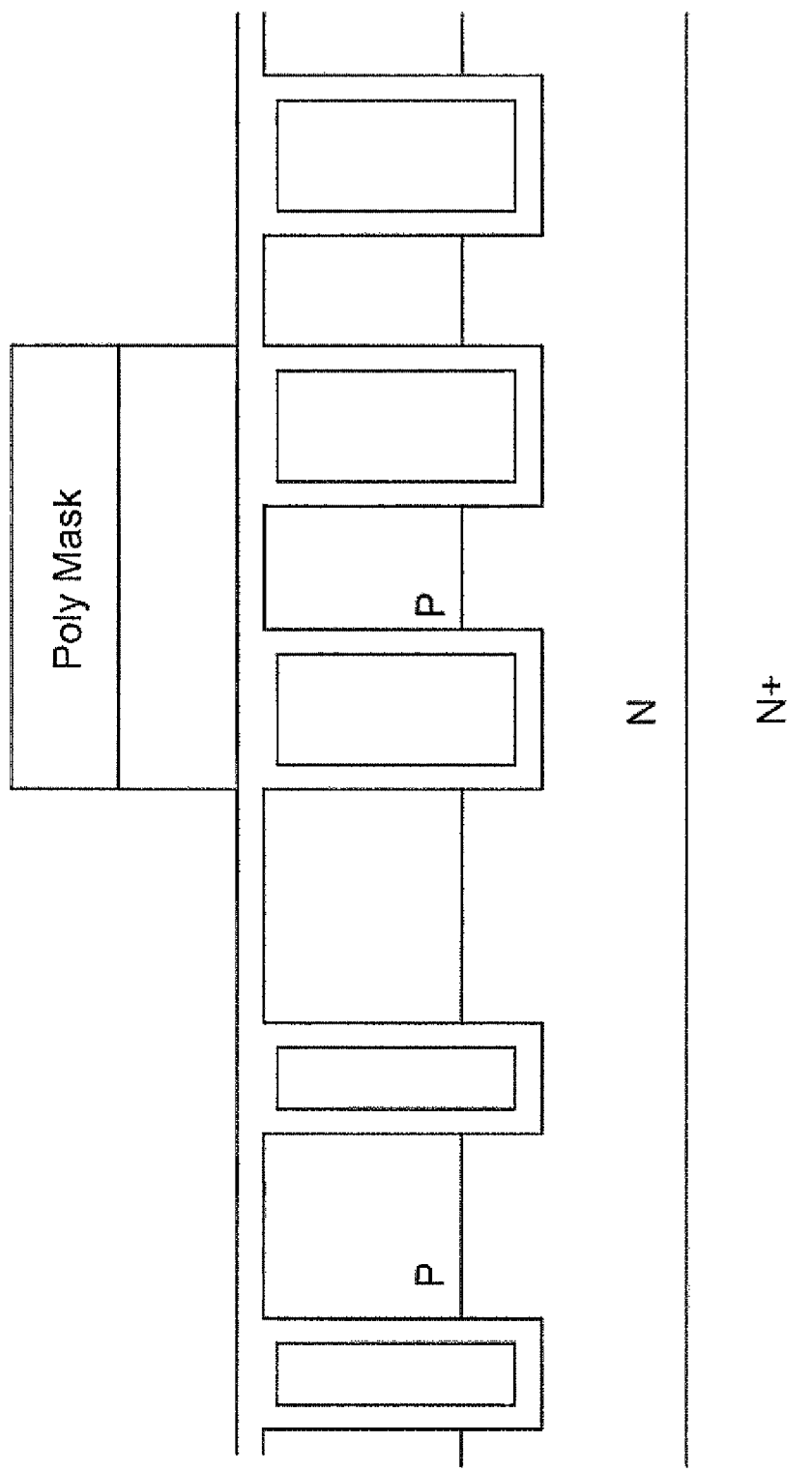
Figure 2E:
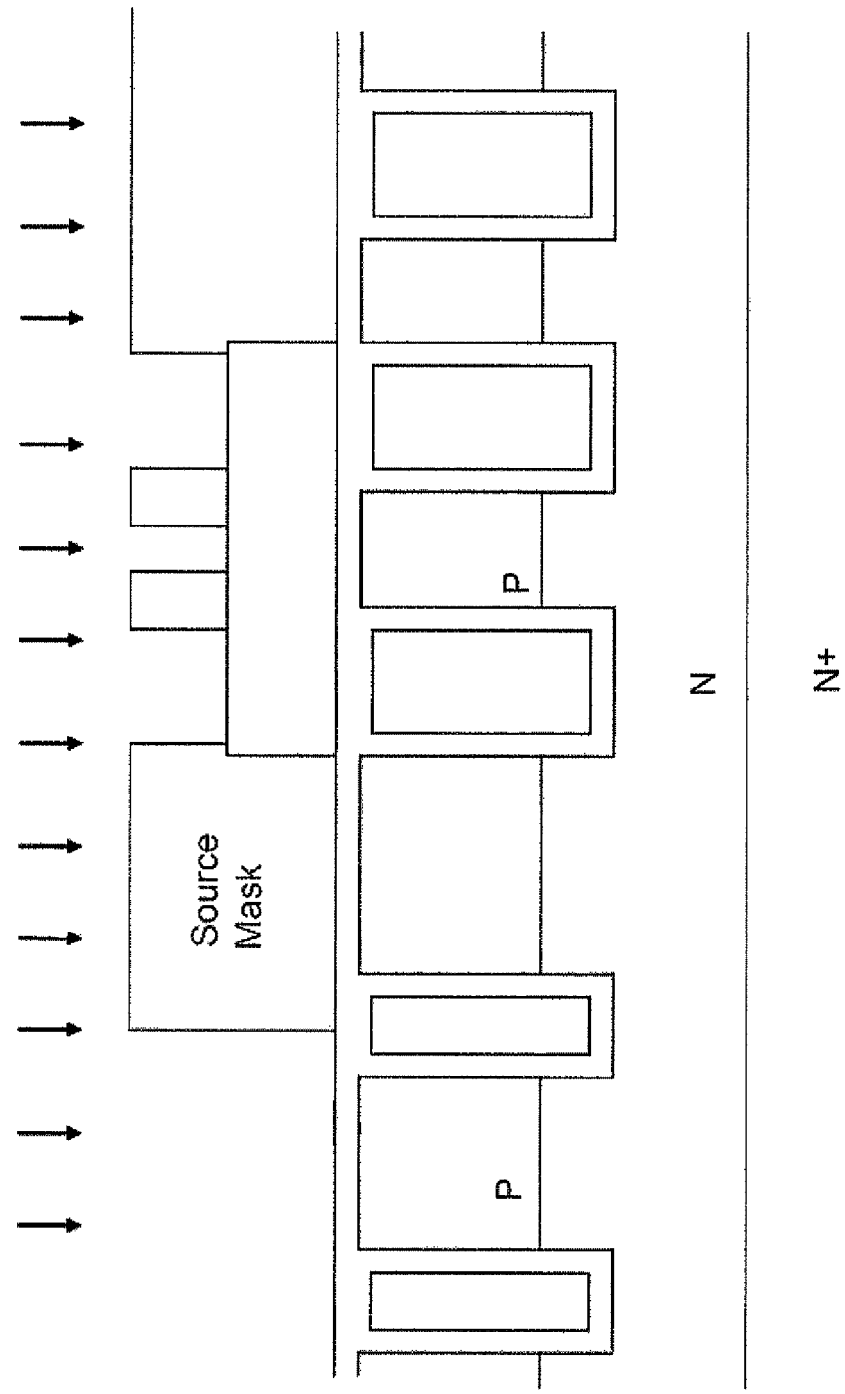
Figure 2F:
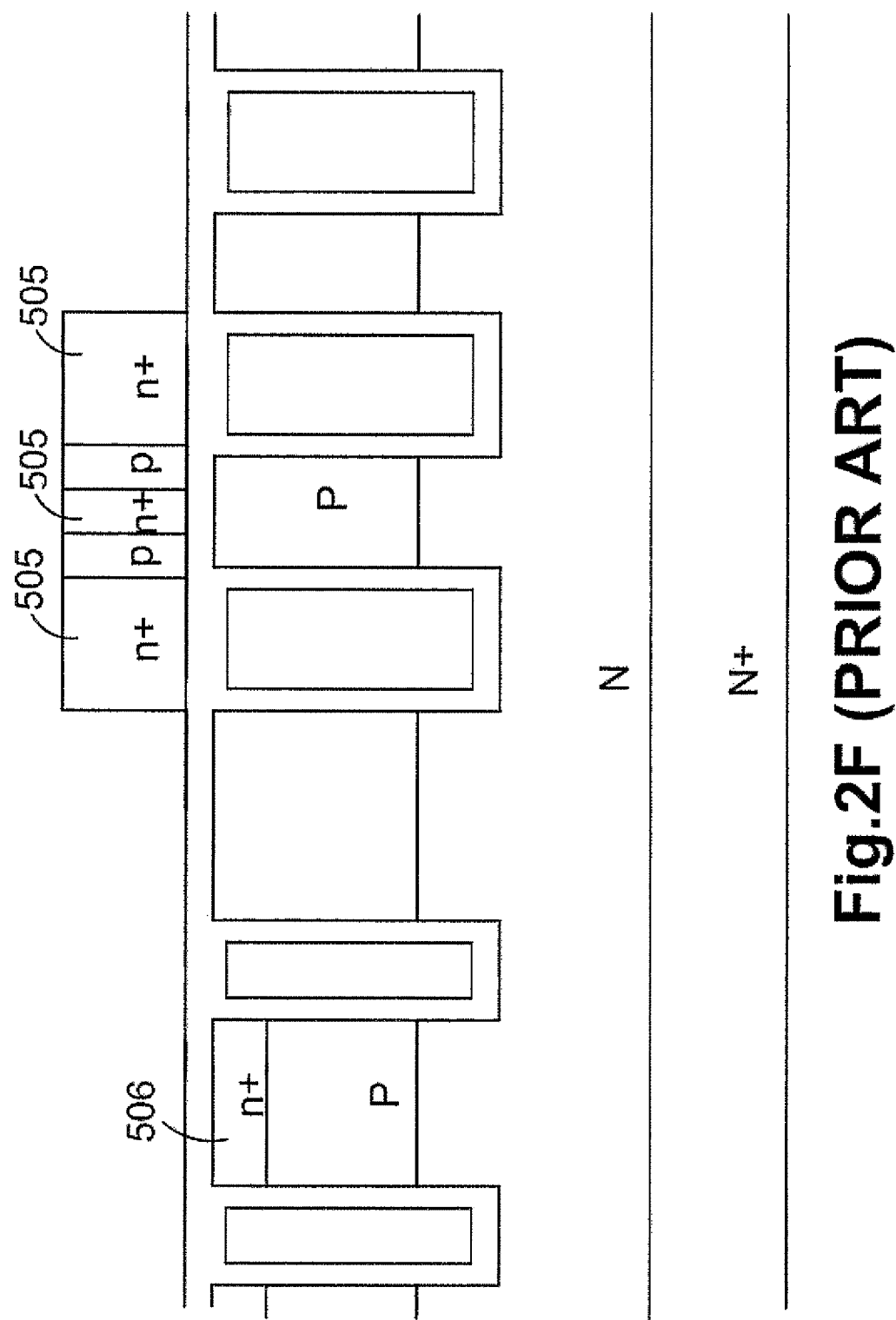
Figure 2G:
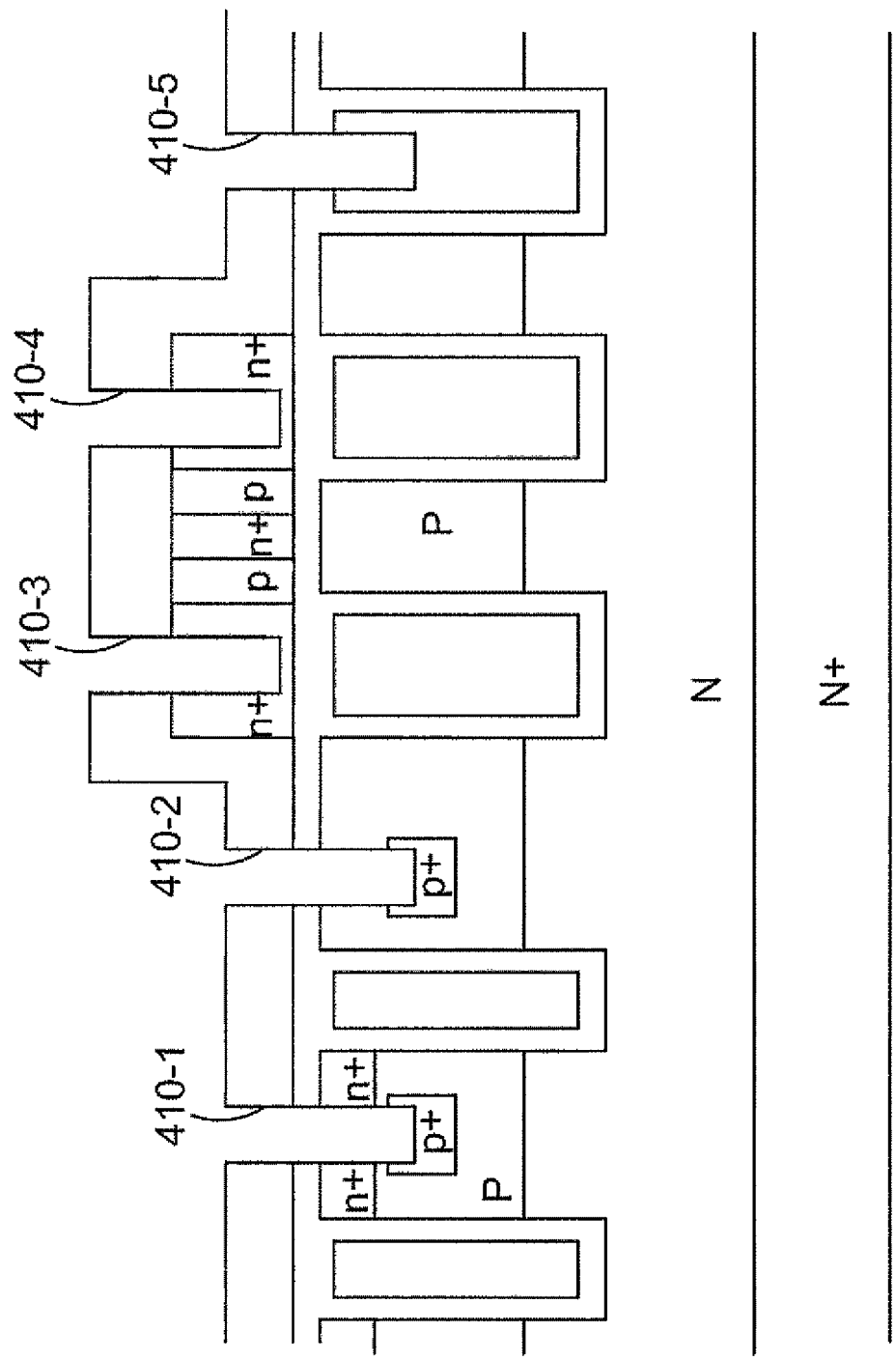
Figure 2H:
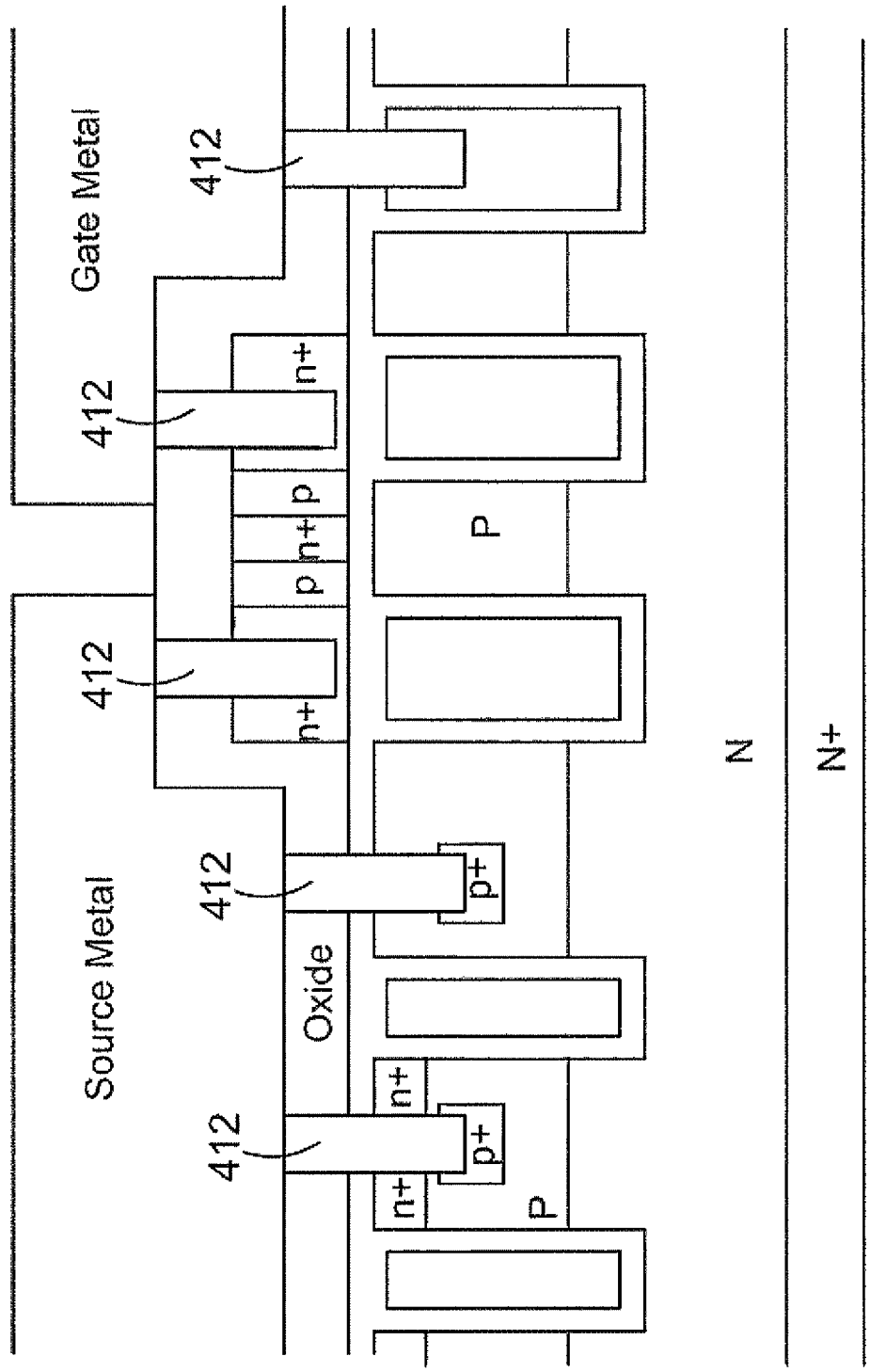
Figure 3A:
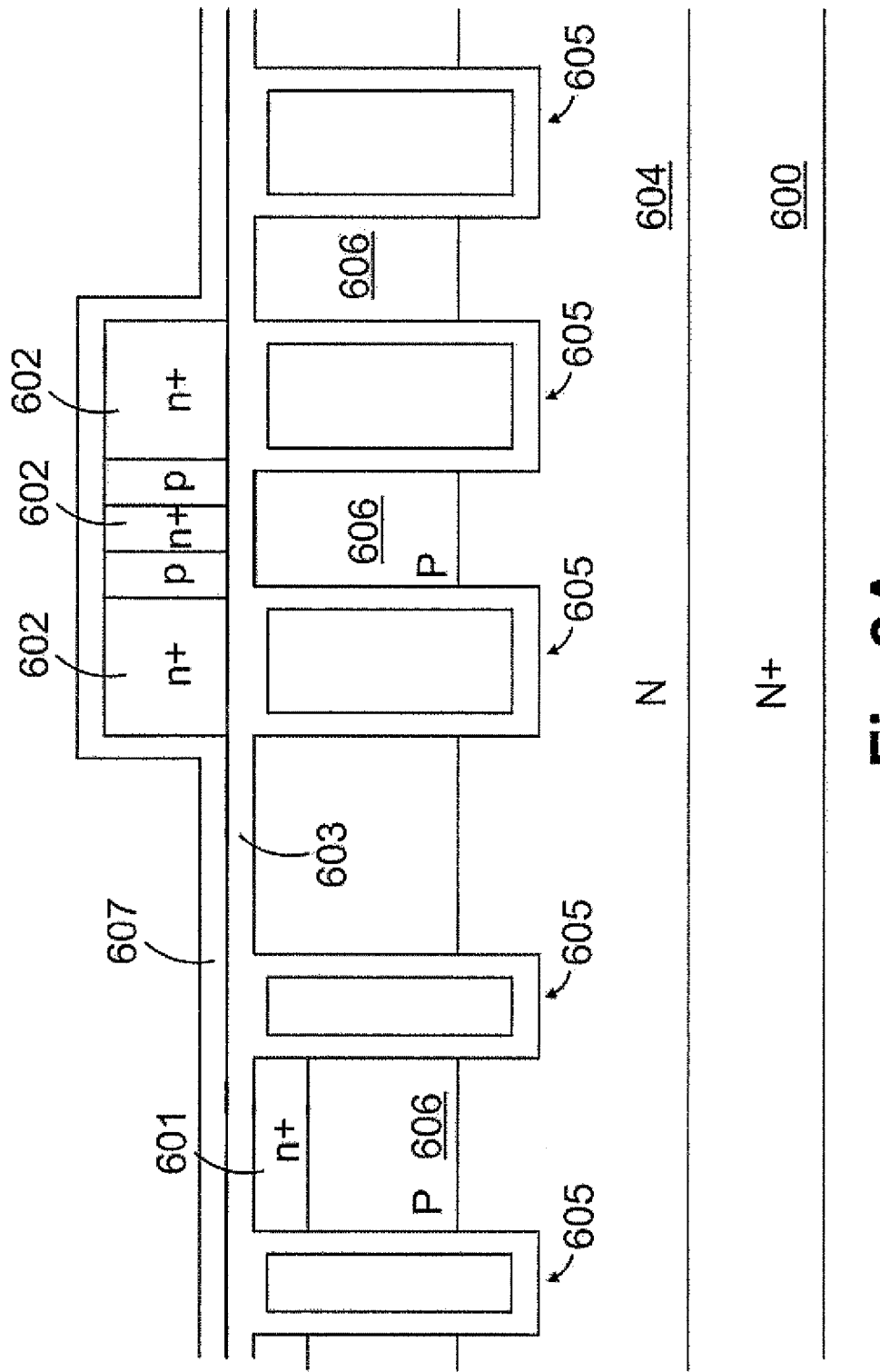
FIGS. 3A to 3C are a serial of side cross-sectional views for showing some process steps for making a trench MOSFET integrated with ESD protection diodes according to a preferred embodiment of the present invention.
Figure 3B:
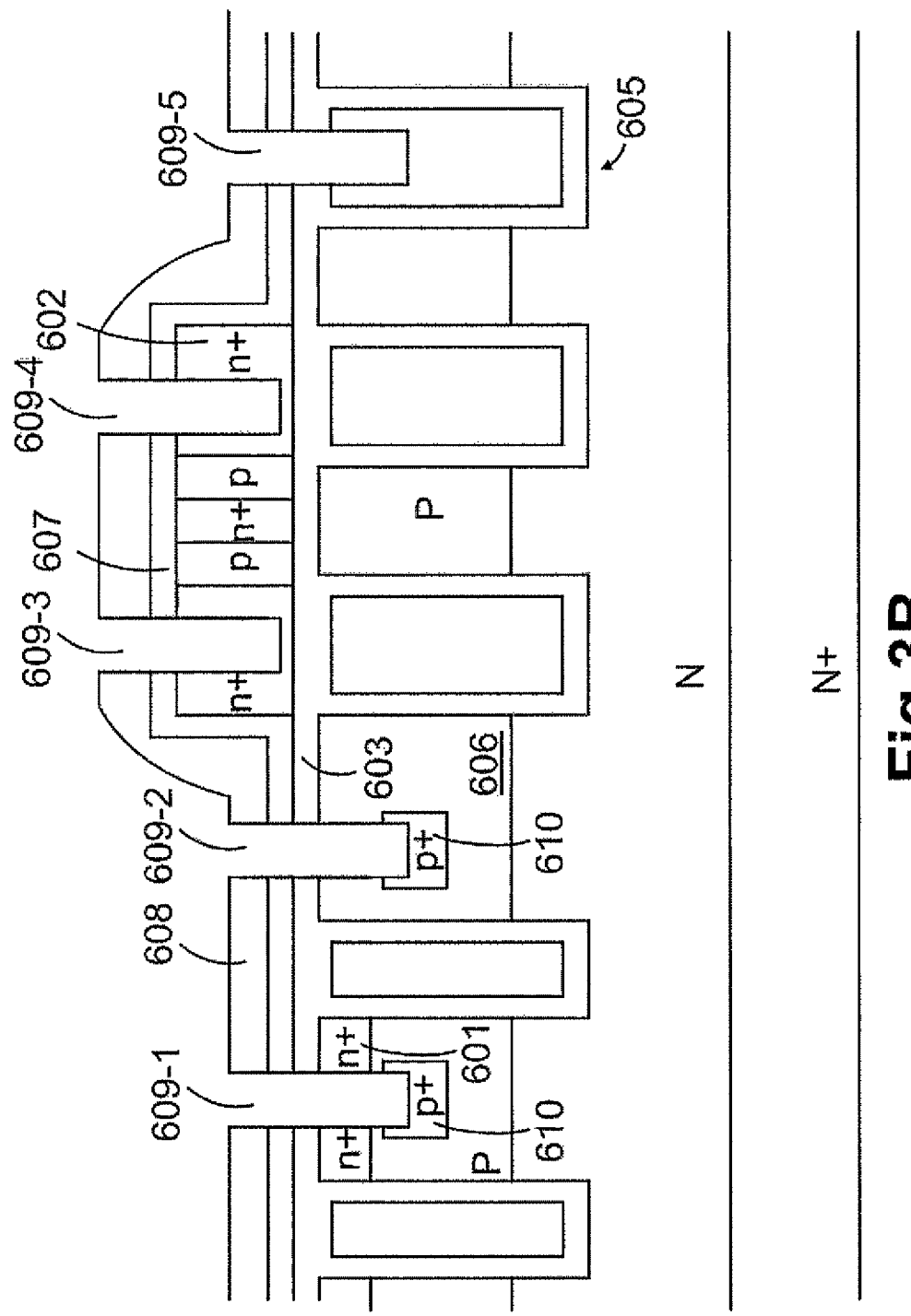
Figure 3C:
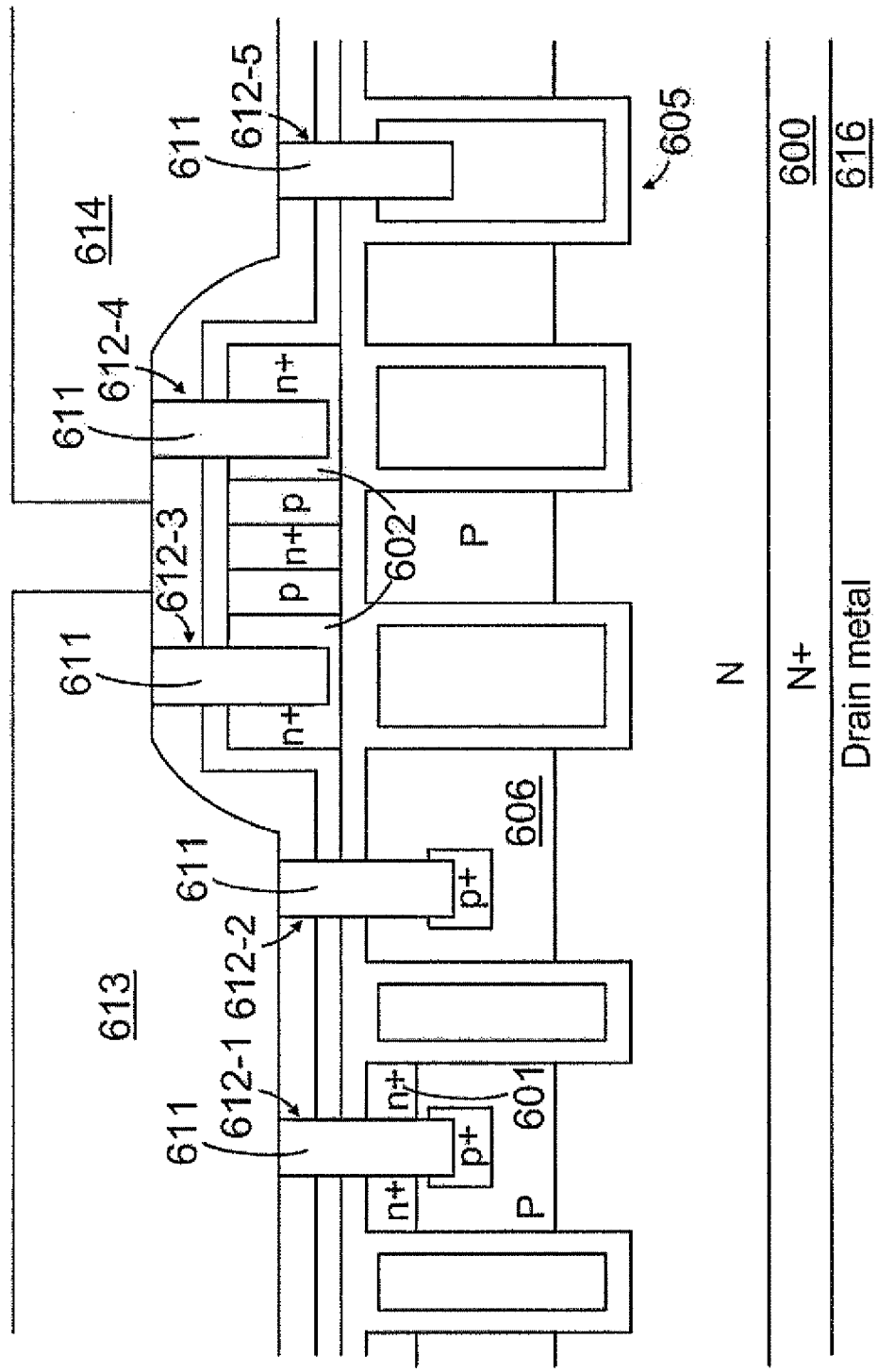

Please refer to FIGS. 3A to 3C for a preferred embodiment according to the present invention in which an N-channel (it also can be implemented as P-channel) trench MOSFET integrated with ESD protection diodes is formed onto an N+ substrate 600. In FIG. 3A, the manufacturing process is similar to FIGS. 2A~2E until the Arsenic ion implantation for formation of n+ source regions 601 and for n+ cathode regions 602 in the integrated ESD protection diodes. Wherein the integrated ESD protection diodes are formed onto a first oxide layer 603 onto an N epitaxial layer 604 in which a plurality of trenched gates 605 and a plurality of P body regions 606 are formed. Wherein, there is trenched gate 605 located right below an n+ cathode region 602 on each side of the integrated ESD protection diodes to act as a buffer trenched gate. Then, according to the present invention, an un-doped oxide layer having thickness ranging from 0.5KÅ~3KÅ is deposited along outer surface of the integrated ESD protection diodes and along top surface of the first oxide layer 603 to act as a dopant out-diffusion suppression layer 607 to avoid source dopant out diffusion issue from the integrated ESD protection diodes during the followed step of source activation or diffusion. The dopant out-diffusion suppression layer 607 is also acted as a first contact interlayer on top surface of the ESD protection diodes.

In FIG. 3B, a second contact interlayer 608, which can be implemented by using a BPSG layer, is deposited covering top of the source dopant out-diffusion suppression layer 607 followed by a step of BPSG flow. Then, after applying a contact mask, a plurality of contact trenches are etched penetrating through the second contact interlayer 608 and the source dopant out-diffusion suppression layer 607, and respectively further: penetrating through the first oxide layer 603, the n+ source region 601 and extending into the P body region 606 to act as a source-body contact trench 609-1; penetrating through the first oxide layer 603 and extending into the P body region 606 adjacent to the n+ source region 601 to act as a body contact trench 609-2; extending into the n+ cathode regions 602 to act as at least two ESD contact trenches 609-3 and 609-4 right above the buffer trenched gates; extending into one of the trenched gates 605 to act as a gate contact trench 609-5. After that, a BF2 ion implantation is carried out to form a p+ body contact doped region in the P body region 606 and surrounding at least bottom of each the source-body contact trench 609-1 and the body contact trench 609-2.

In FIG. 3C, a layer of Ti/TiN and tungsten are successively deposited and then etched back to form a contact metal plug 611 in each of the contact trenches formed in FIG. 3B to respective form: a trenched source-body contact 612-1; a trenched body contact 612-1; at least two trenched ESD contacts 612-3 and 612-4; and a trenched gate contact 612-5. Then, a layer of front metal is deposited onto top of the N-channel trench MOSFET. After applying a metal mask, the front metal is etched to be patterned into a source metal 613 and a gate metal 614. Wherein, the source metal 613 is shorted to the n+ source region 601 and the P body region 606 through the trenched source-body contact 612-1 and through the trenched body contact 612-2, and is as well as shorted to one of the n+ cathode regions 602 through one of the trenched ESD contacts 612-3; the gate metal 614 is shorted to the one of the trenched gates 605 through the trenched gate contact 612-5 for gate contact, and is also shorted to another n+ cathode region 602 through another trenched ESD contact 612-4. Then, a back metal is deposited on rear side of the N+ substrate 600 after grinding to serve as a drain metal 616.

Figure 4:
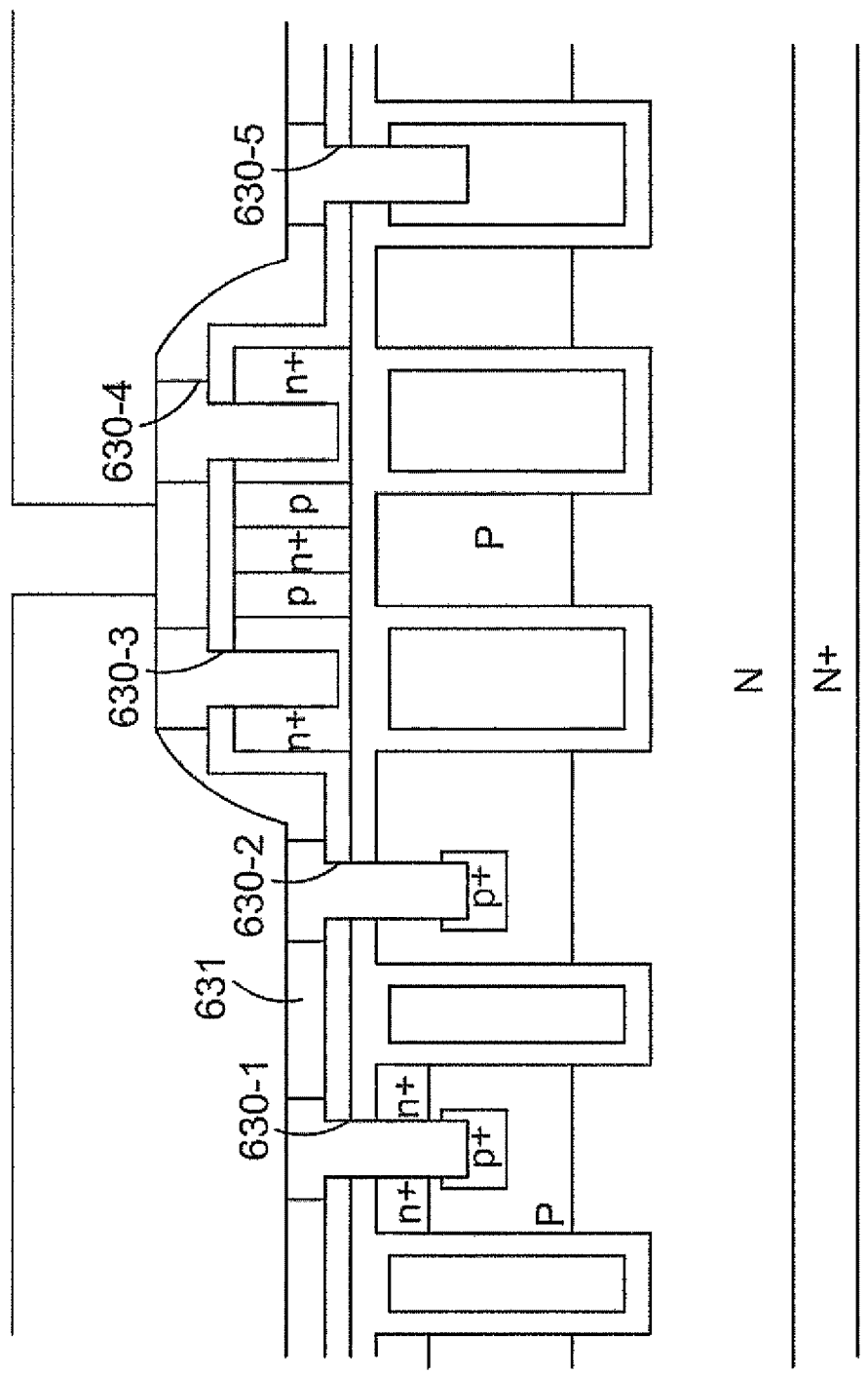
FIG. 4 is a side cross-sectional view for showing a process step for making a trench MOSFET integrated with ESD protection diodes according to another preferred embodiment of the present invention.

Please refer to FIG. 4 for another preferred embodiment of the present invention to make a trench MOSFET integrated with ESD protection diodes, which is similar to FIGS. 3A~3C except that, after a plurality of contact trenches 630-1~630-5 are formed, an additional step is carried out by using dilute HF dip to enlarge top surface contact CD of the contact trenches 630-1~630-5 in the second contact interlayer 631 BPSG by selectively remove 500 Å~1000 Å BPSG prior to the step of Ti/TiN deposition.

Figure 5A:
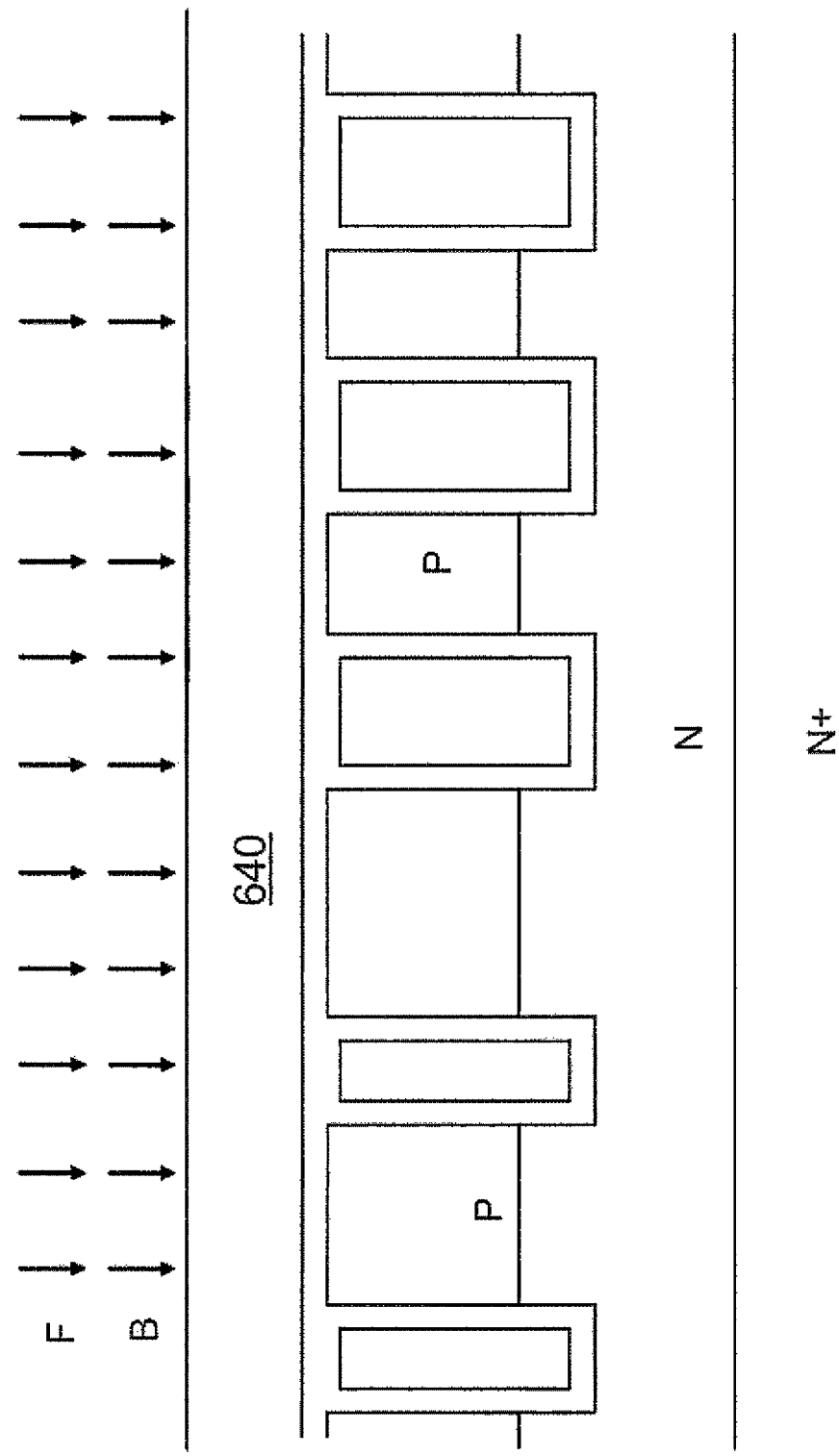
FIGS. 5A to 5B are a serial of side cross-sectional views for showing some process steps for making a trench MOSFET integrated with ESD protection diodes according to another preferred embodiment of the present invention.
Figure 5B:
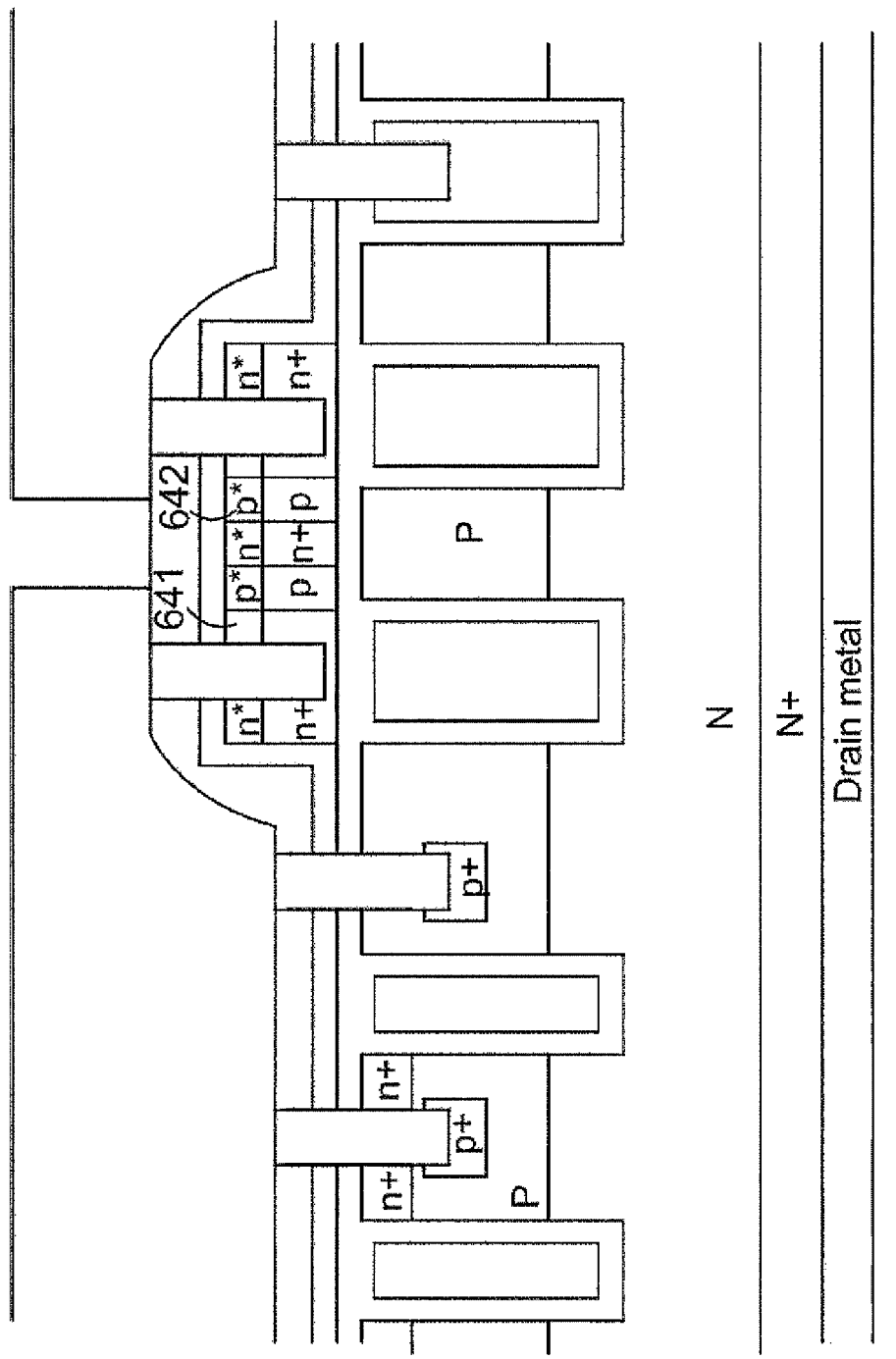

Please refer to FIGS. 5A~5B for another preferred embodiment of the present invention to make a trench MOSFET integrated with ESD protection diodes, which is similar to FIGS. 3A~3C except that, in FIG. 5A, after a blank Boron ion implantation (B, as illustrated) is carried out into an un-doped poly-silicon layer 640 to make it doped with P type dopant for formation of P type regions of ESD protection diodes, another Fluorine ion implantation (F, as illustrated) is carried out into the now P doped poly-silicon layer 640 for formation of an additional dopant out-diffusion suppression layer in the top portion of ESD protection diodes containing Fluorine which is same as that in patent application Ser. No. 13/417,397. In FIG. 5B, after performing the same manufacturing steps as FIGS. 3B~3C, the additional dopant out-diffusion suppression layer comprising a plurality of n* doped regions 641 and a plurality of p* doped regions 642 is formed in the top portion of the ESD protection diodes.

Figure 6:
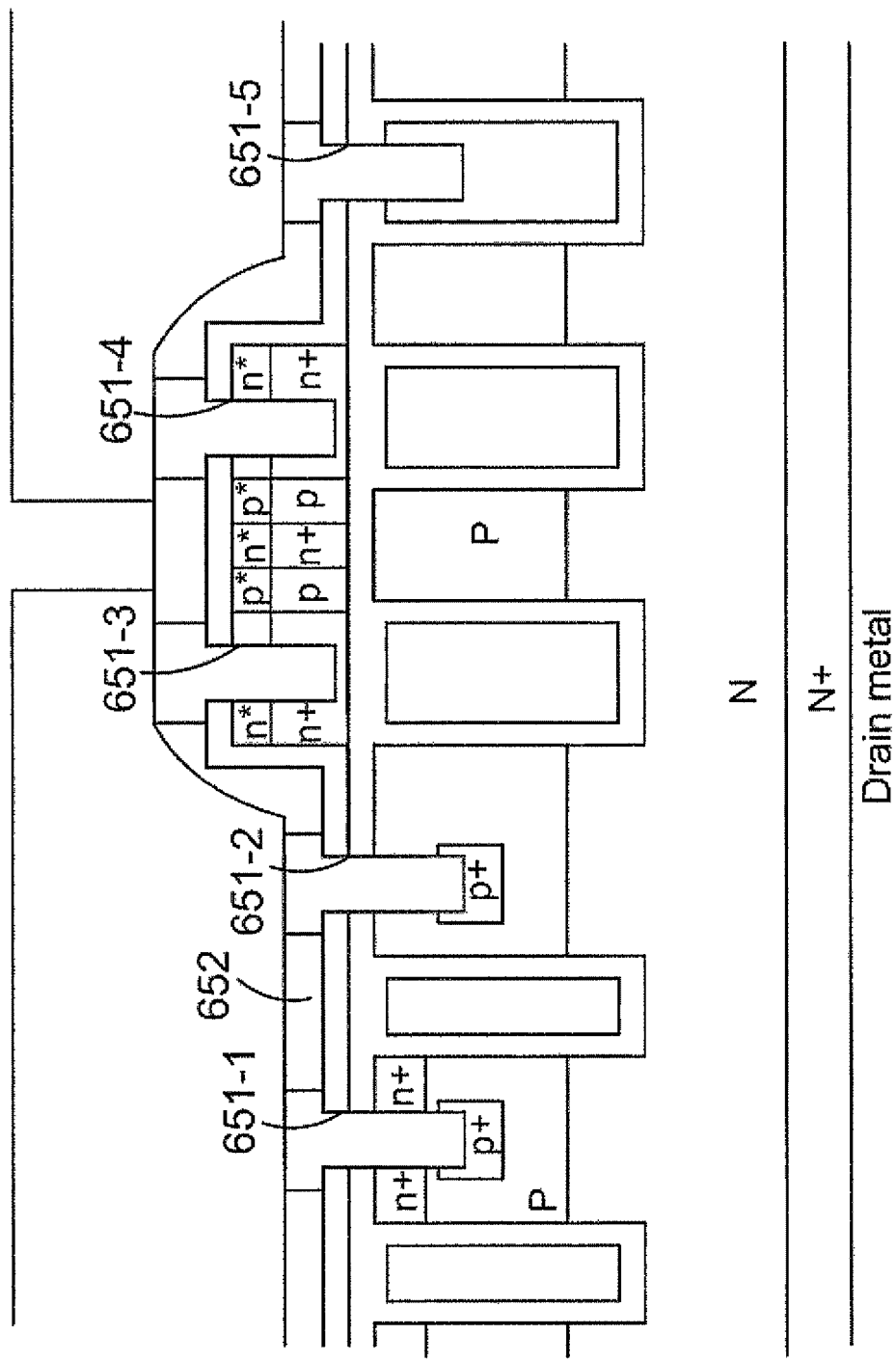
FIG. 6 is a side cross-sectional view for showing a process step for making a trench MOSFET integrated with ESD protection diodes according to another preferred embodiment of the present invention.

Please refer to FIG. 6 for another preferred embodiment of the present invention to make a trench MOSFET integrated with ESD protection diodes, which is similar to FIGS. 5A~5B except that, after a plurality of contact trenches 651-1~651-5 are formed, an additional step is carried out by using dilute HF dip to enlarge top surface contact CD of the contact trenches 651-1~651-5 in the second contact interlayer 652 by selectively remove 500 Å~1000 Å BPSG prior to the step of Ti/TiN deposition.

Figure 7A:
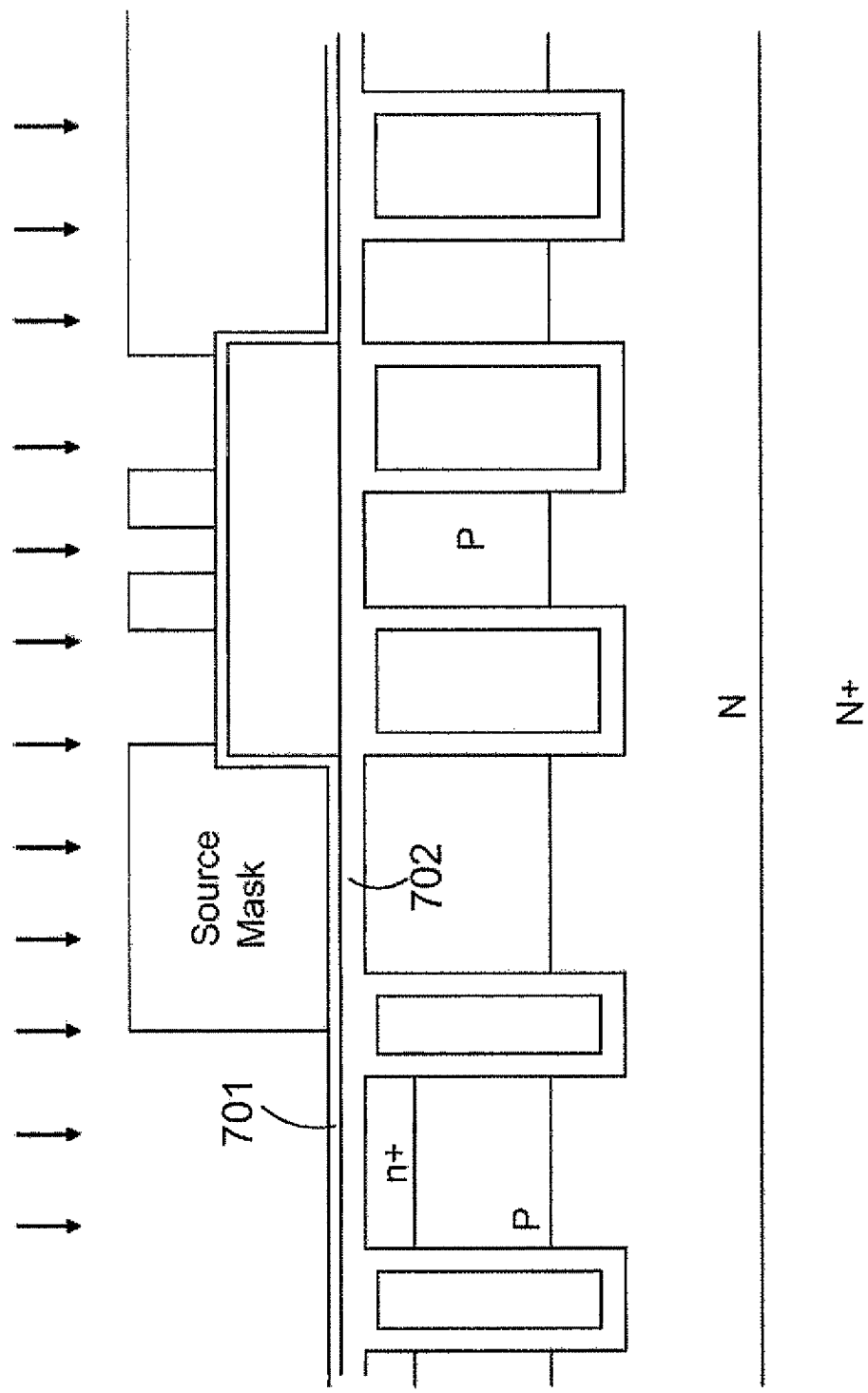
FIGS. 7A to 7B are a serial of side cross-sectional views for showing some process steps for making a trench MOSFET integrated with ESD protection diodes according to another preferred embodiment of the present invention.
Figure 7B:
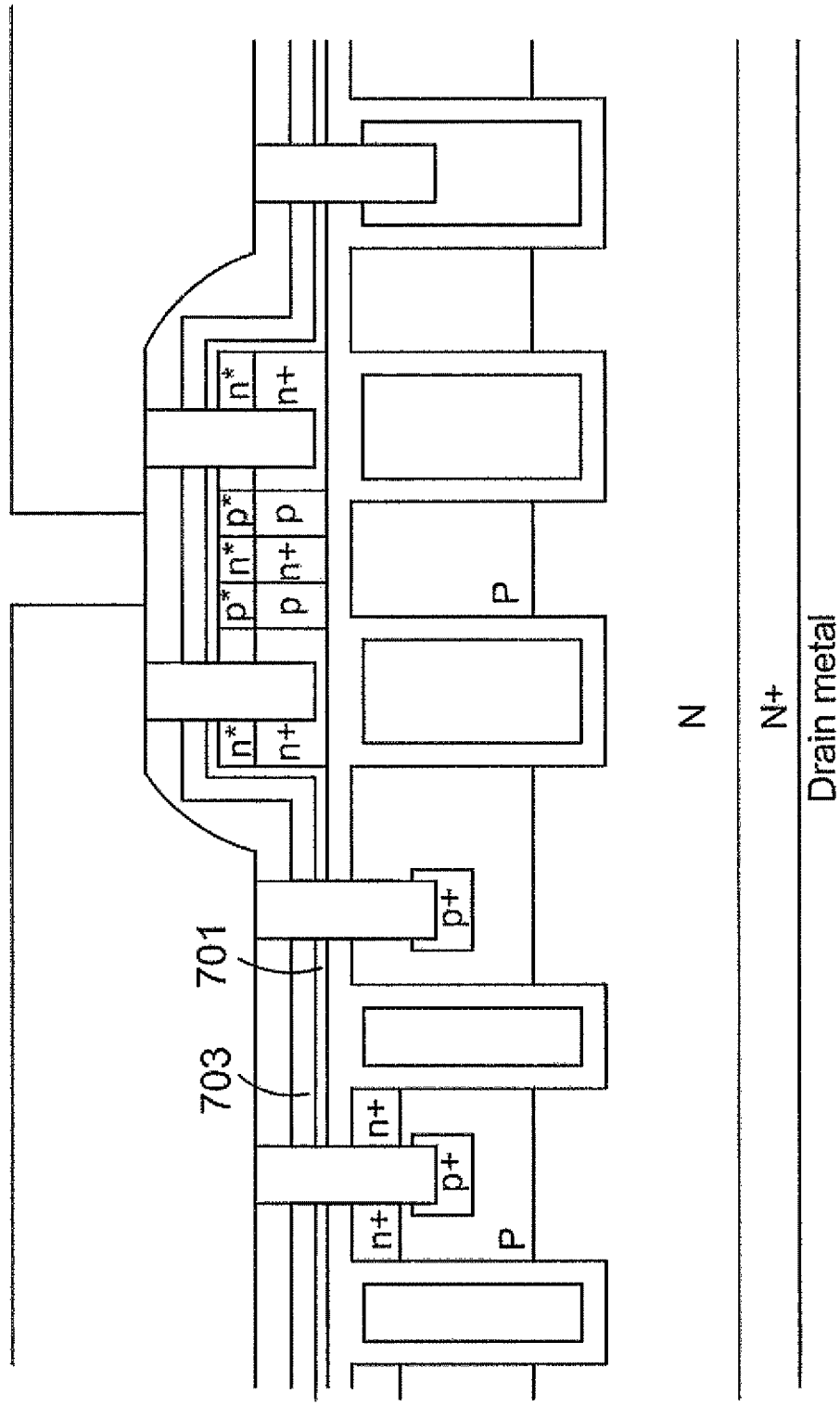

Please refer to FIGS. 7A~7B for another preferred embodiment of the present invention to make a trench MOSFET integrated with ESD protection diodes, which is similar to FIGS. 5A~5B except that, after performing the manufacturing steps same as in FIG. 5A, a thin oxide layer is deposited covering outer surface of the ESD protection diodes and along top of the first oxide layer 702 to act as a source dopant screen oxide 701 for the followed step of source dopant ion implantation by applying a source mask. Then, as shown in FIG. 7B, after performing the manufacturing steps same as FIGS. 3B~3C, the source dopant screen oxide 701 is padded underneath the dopant out-diffusion suppression layer 703.

Figure 8:
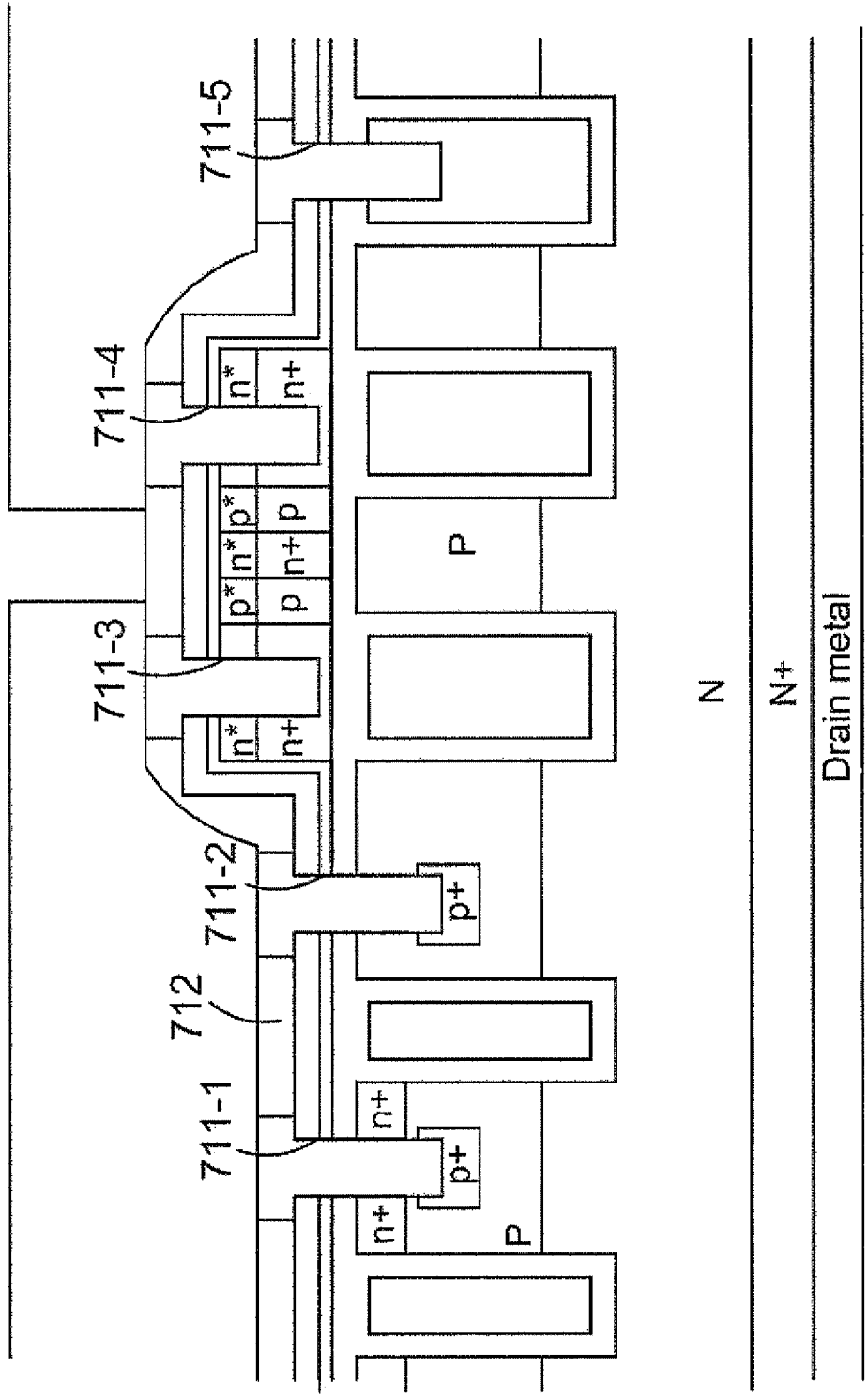
FIG. 8 is a side cross-sectional view for showing a process step for making a trench MOSFET integrated with ESD protection diodes according to another preferred embodiment of the present invention.

Please refer to FIG. 8 for another preferred embodiment of the present invention to make a trench MOSFET integrated with ESD protection diodes, which is similar to FIGS. 7A~7B except that, after a plurality of contact trenches 711-1~711-5 are formed, an additional step is carried out by using dilute HF dip to enlarge top surface contact CD of the contact trenches 711-1~711-5 in the second contact interlayer 712 by selectively remove 500 Å~1000 Å BPSG prior to the step of Ti/TiN deposition.

Figure 9A:
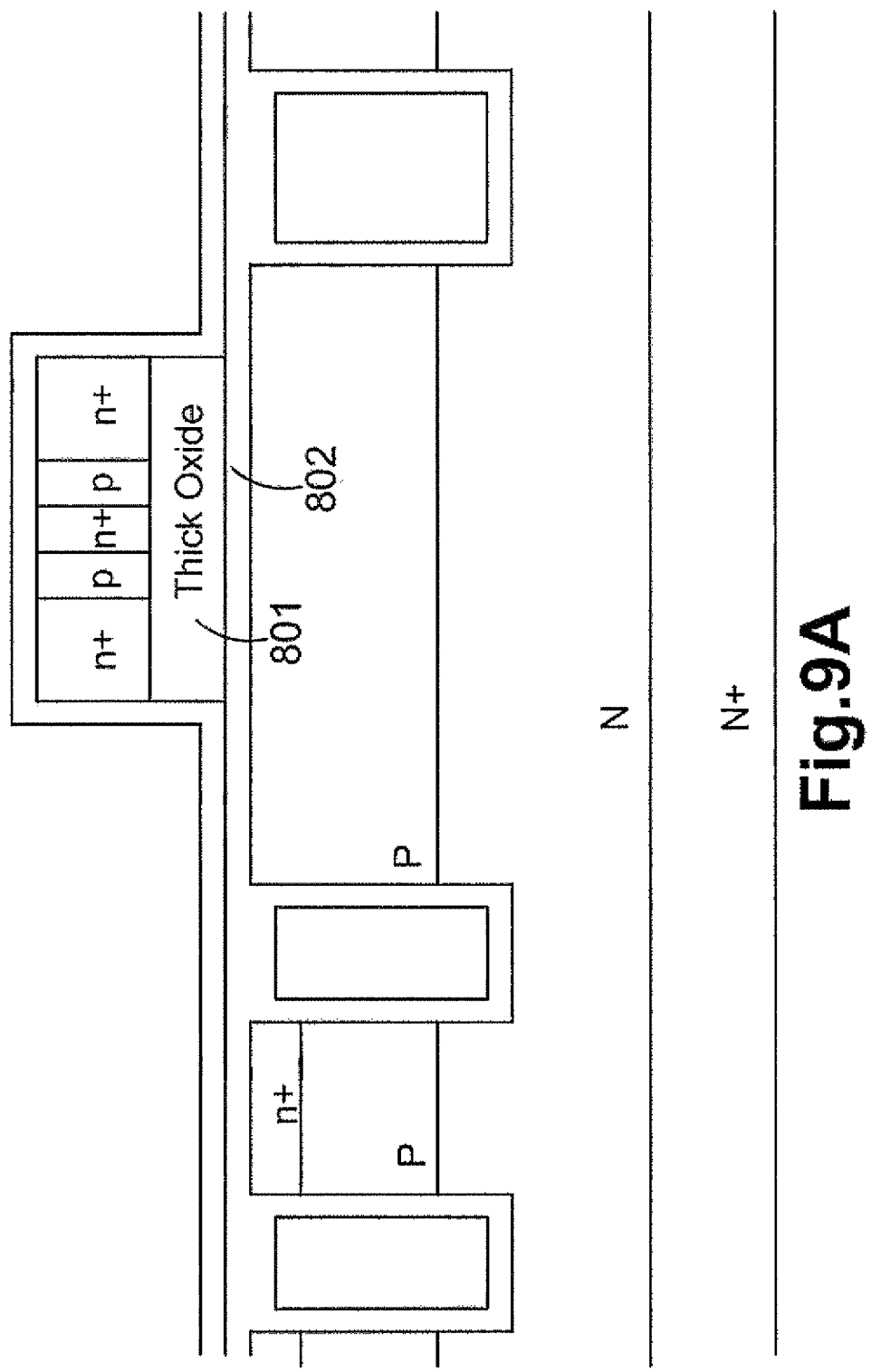

Please refer to FIGS. 9A~9B for another preferred embodiment of the present invention to make a trench MOSFET integrated with ESD protection diodes, which is similar to FIGS. 3A~3C except that, prior to the step of depositing an un-doped poly-silicon layer for the ESD protection diodes, a thick oxide layer 801 is deposited onto the first oxide layer 802 and is patterned by the poly mask at the same step as patterning the poly-silicon layer for the ESD protection diodes. Then, as shown in FIG. 9B, after performing the same manufacturing steps as FIGS. 3A~3C, the thick oxide layer 801 is padded underneath the ESD protection diodes to act as a buffer layer to avoid over-etching issue from happening.

Figure 10A:
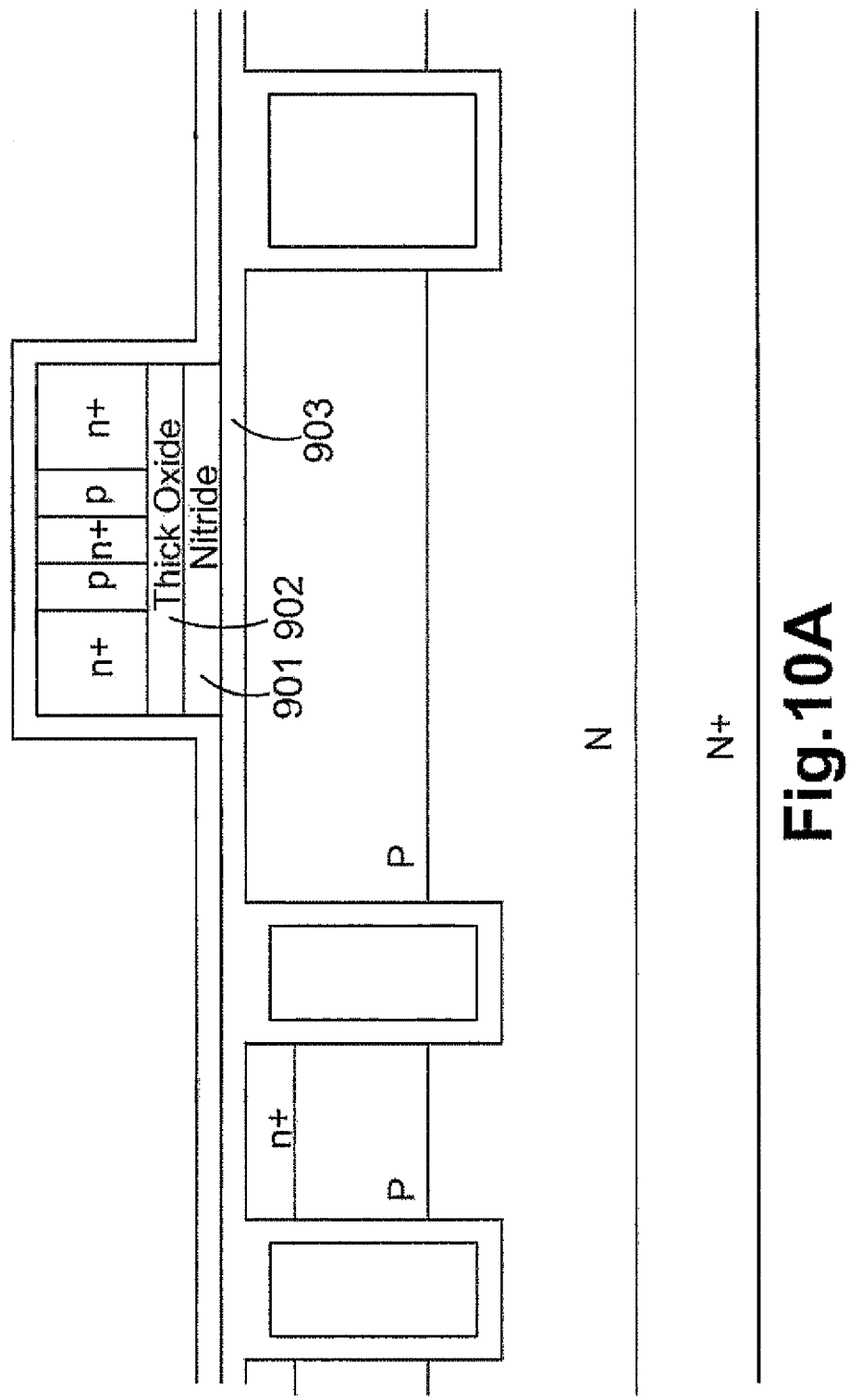
FIGS. 10A to 10B are a serial of side cross-sectional views for showing some process steps for making a trench MOSFET integrated with ESD protection diodes according to another preferred embodiment of the present invention.
Figure 10B:
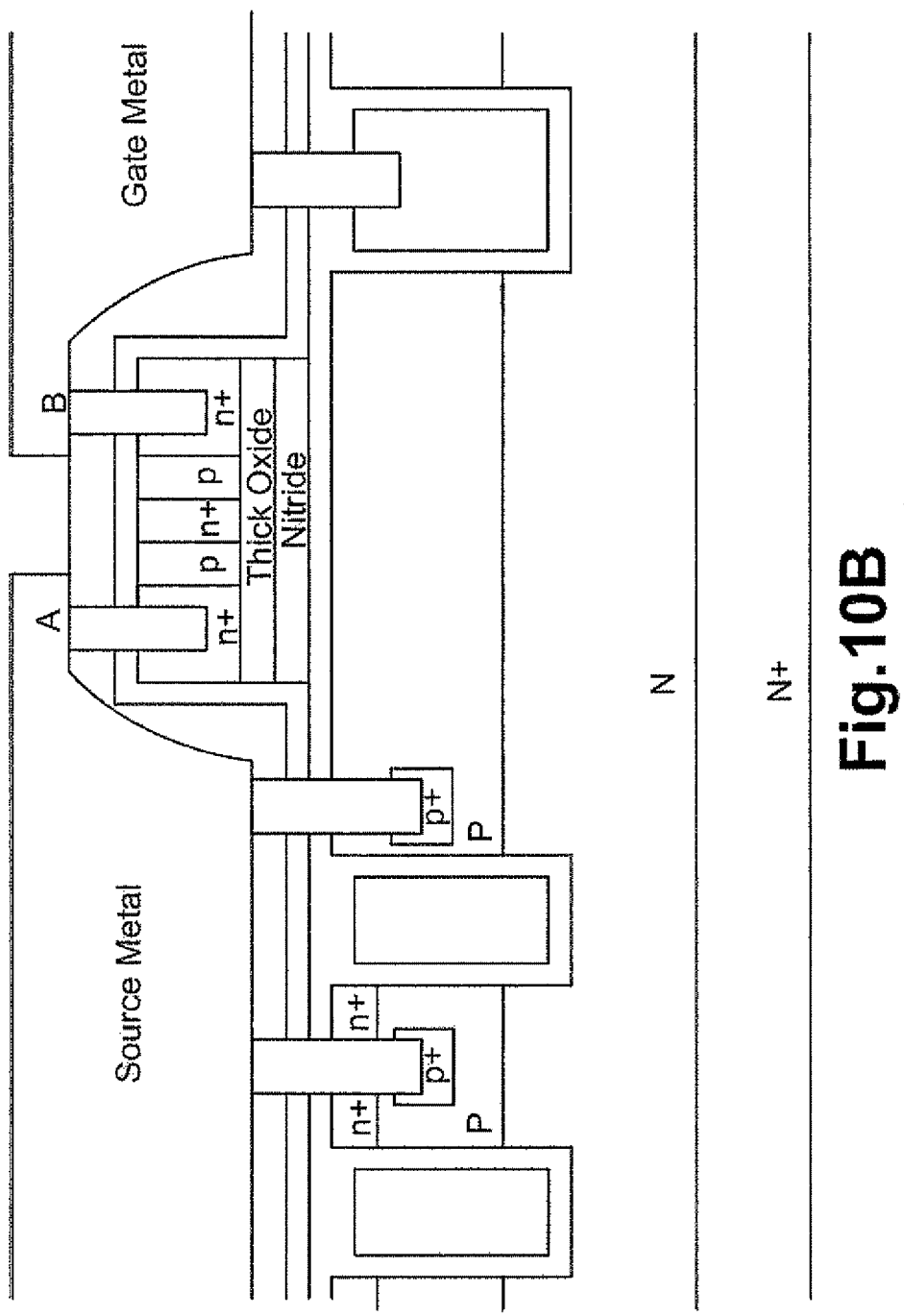

Please refer to FIGS. 10A~10B for another preferred embodiment of the present invention to make a trench MOSFET integrated with ESD protection diodes, which is similar to FIGS. 3A~3C except that, prior to the step of depositing an un-doped poly-silicon layer for the ESD protection diodes, a nitride layer 901 and a thick oxide layer 902 are successively deposited onto the first oxide layer 903 to form ONO structure and are patterned by the poly mask at the same step as patterning the poly-silicon layer for the ESD protection diodes. Then, as shown in FIG. 10B, after performing the same steps as FIGS. 3A~3C, the thick oxide layer 902 and the nitride layer 901 are padded underneath the ESD protection diodes to act as a buffer layer to avoid over-etching issue from happening.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

TABLE 1

Effect of thick oxide suppression layer on Igss and BVgss of ESD Diode (Exp. Data)

| Condition | Avg. Igss At Vgs = 20 V | Igss std dev. | Avg. BVgss At Igss = 300 uA | BVgss std dev. |
|---|---|---|---|---|
| Without source dopant out-diffusion suppression layer (prior Arts) | 7.23 uA | 0.76 uA | 25.58 V | 0.97 V |
| With source dopant out-diffusion suppression layer (This invention) | 8.35 uA | 0.12 uA | 24.70 V | 0.12 V |

What is claimed is:

1. A method of manufacturing a semiconductor power device integrated with at least one ESD protection diode, comprising:

forming an epitaxial layer of a first conductivity type;

forming a plurality of trenched gates, and a plurality of body regions of a second conductivity type in said epitaxial layer;

depositing an un-doped poly-silicon layer;

carrying out ion implantation with dopant of said second conductivity type;

applying a poly mask and etching said un-doped poly-silicon layer to leave necessary portion for formation of the ESD protection diode;

applying a source mask;

carrying out source dopant ion implantation for formation of source regions and cathode (or anode) regions in said ESD protection diode;

forming a dopant out-diffusion suppression layer as a first contact interlayer after source dopant ion implantation, wherein said dopant out-diffusion suppression layer covering outer surface of said ESD protection diode comprising multiple back-to-back doped regions with said first conductivity type next to said second conductivity type;

performing source dopant activation or diffusion;

depositing a second contact interlayer on top of said first contact interlayer;

applying a contact mask and forming a plurality of contact trenches starting from top of said second contact interlayer, wherein said contact trenches comprise at least two ESD contact trenches and a plurality of source-body contact trenches, each of said ESD contact trenches further extending into a cathode (or anode) region on each side of said ESD protection diodes, said source-body contact trenches further penetrating through said source regions and extending into said body regions;

carrying out ion implantation with dopant of said second conductivity type to form a body contact doped region surrounding at least bottom of the source-body contact trench;

forming a contact metal plug in each of said contact trenches;

depositing a front metal on top of said second contact interlayer;

applying a metal mask and patterning said front metal into a source metal and a gate metal.

2. The method of claim 1, wherein said dopant out-diffusion layer is un-doped oxide.

3. The method of claim 1, wherein said second contact interlayer is BPSG.

4. The method of claim 3, prior to forming said contact metal plug, comprising an additional dilute HF dip to enlarge top surface contact CD of each of said contact trenches in said second contact interlayer by selectively removing 500 Å~1000 Å of said second contact interlayer.

5. The method of claim 1, prior to applying said poly mask, further comprising carrying out a Fluorine ion implantation into said un-doped poly-silicon layer for further formation of an additional dopant out-diffusion suppression layer containing the Fluorine ion in top portion of said ESD protection diode.

6. The method of claim 1, after etching said poly-silicon layer and prior to applying said source mask, further comprising depositing a thin oxide layer covering outer surface of the remained poly-silicon layer as a source dopant screen oxide for source dopant ion implantation.

7. The method of claim 1, further forming a buffer trenched gate underneath each of said ESD contact trenches penetrating through said first and second contact interlayers and extending into said ESD protection diode, wherein said buffer trenched gate is formed simultaneously with said trenched gates.

8. The method of claim 1, prior to depositing said un-doped poly-silicon layer, further comprising depositing a thick oxide layer, wherein said thick oxide layer is then be patterned by said poly mask which is used to pattern said poly-silicon layer.

9. The method of claim 1, prior to depositing said un-doped poly-silicon layer, further comprising successively depositing a nitride layer and a thick oxide layer, wherein said thick oxide layer and said nitride layer are then be patterned by said poly mask which is used to pattern said poly-silicon layer.

10. The method of claim 1, wherein said contact metal plug is tungsten plug padded by a barrier layer of Ti/TiN.

11. The method of claim 2, wherein said dopant out-diffusion suppression layer has oxide thickness ranging from 0.5KÅ to 3 KÅ.

12. A semiconductor power device integrated with at least one ESD protection diode formed by the method of claim 1.

* * * * *